(12) United States Patent
Lee et al.

(10) Patent No.: US 9,490,391 B2
(45) Date of Patent: Nov. 8, 2016

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Jong Hyun Lee, Suwon-si (KR); Min Hwan Kim, Anyang-si (KR); Eun Deok Sim, Yongin-si (KR); Ji Heon Oh, Suwon-si (KR); Heon Ho Lee, Seongnam-si (KR); Ho Chul Lee, Seongnam-si (KR); Jae Sung Hyun, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/731,391

(22) Filed: Jun. 4, 2015

(65) Prior Publication Data
US 2016/0111595 A1 Apr. 21, 2016

(30) Foreign Application Priority Data
Oct. 15, 2014 (KR) .......................... 10-2014-0138881

(51) Int. Cl.
*H01L 29/06* (2006.01)
*H01L 31/0328* (2006.01)
(Continued)

(52) U.S. Cl.
CPC ............... *H01L 33/06* (2013.01); *H01L 33/08* (2013.01); *H01L 33/32* (2013.01)

(58) Field of Classification Search
CPC ....... H01L 33/32; H01L 33/06; H01L 33/04; H01L 33/08; H01L 29/122; H01L 31/035236

USPC ....................................... 257/13, 14, E33.008
See application file for complete search history.

(56) References Cited

U.S. PATENT DOCUMENTS 6,372,608 B1 4/2002 Shimoda et al.
6,645,830 B2 11/2003 Shimoda et al.
(Continued)

FOREIGN PATENT DOCUMENTS

JP 2010-027924 A 2/2010
JP 2014-067893 A 4/2014
(Continued)

OTHER PUBLICATIONS

Yang Bin et al., "A GaN-AlGaN-InGaN last quantum barrier in an InGaN/GaN multiple-quantum-well blue LED", Chin. Phys. B, vol. 23, No. 4, (2014) 048502, Feb. 10, 2014.

*Primary Examiner* — Thien F Tran
(74) *Attorney, Agent, or Firm* — Muir Patent Law, PLLC

(57) ABSTRACT

A semiconductor light emitting device may include: a first conductivity-type semiconductor layer; an active layer disposed on the first conductivity-type semiconductor layer and including a plurality of quantum barrier layers and a plurality of quantum well layers which are alternately stacked; and a second conductivity-type semiconductor layer disposed on the active layer. A quantum barrier layer closest to the second conductivity-type semiconductor layer, among the plurality of quantum barrier layers, may include a first undoped region and a first doped region disposed on the first undoped region and having a thickness greater than or equal to that of the first undoped region. Each of the first undoped region and the first doped region may include a plurality of first unit layers having different energy band gaps, and at least one hole accumulation region.

20 Claims, 16 Drawing Sheets

(51) Int. Cl.
   *H01L 31/0336*   (2006.01)
   *H01L 31/072*    (2012.01)
   *H01L 31/109*    (2006.01)
   *H01L 33/06*     (2010.01)
   *H01L 33/32*         (2010.01)
   *H01L 33/08*         (2010.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,902,544 B2 * | 3/2011 | Kim ............... B82Y 20/00 257/103 |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2010/0230657 A1 | 9/2010 | Kim et al. |
| 2012/0235116 A1 | 9/2012 | Su et al. |
| 2014/0084242 A1 | 3/2014 | Okuno |

FOREIGN PATENT DOCUMENTS

| | | |
|---|---|---|
| KR | 10-2010-0067504 A | 6/2010 |
| KR | 10-2010-0070250 A | 6/2010 |
| KR | 10-2013-0007169 A | 1/2013 |
| KR | 10-2013-0058232 A | 6/2013 |
| KR | 10-2013-0065994 | 6/2013 |
| KR | 10-2014-0072606 A | 6/2014 |

* cited by examiner

SEMICONDUCTOR LIGHT EMITTING DEVICE

CROSS-REFERENCE TO RELATED APPLICATION

This application claims priority under 35 U.S.C. §119 to Korean Patent Application No. 10-2014-0138881 filed on Oct. 15, 2014, with the Korean Intellectual Property Office, the disclosure of which is incorporated herein by reference.

BACKGROUND

The present disclosure relates to a semiconductor light emitting device.

A semiconductor light emitting device is a semiconductor device which emits light of various colors through recombination of electrons and holes in a junction between first and second conductivity-type semiconductors when a current is applied thereto. Compared with a filament-based light emitting device, a semiconductor light emitting device has various advantages such as a longer lifespan, lower power consumption, superior initial driving characteristics, and the like, and thus, demand for semiconductor light emitting devices continues to grow. In particular, recently, Group III-nitride semiconductors which emit short-wavelength blue light have come to prominence.

Various efforts have been attempted to increase the luminous efficiency of semiconductor light emitting devices.

SUMMARY

An exemplary embodiment of the present inventive concept may provide a semiconductor light emitting device having high luminous efficiency by preventing a degradation of an active layer and increasing efficiency in injecting holes and electrons into the active layer.

According to an exemplary embodiment of the present inventive concept, a semiconductor light emitting device may include: a first conductivity-type semiconductor layer; an active layer disposed on the first conductivity-type semiconductor layer and including a plurality of quantum barrier layers and a plurality of quantum well layers which are alternately stacked; and a second conductivity-type semiconductor layer disposed on the active layer. A quantum barrier layer closest to the second conductivity-type semiconductor layer, among the plurality of quantum barrier layers, may include a first undoped region and a first doped region disposed on the first undoped region and having a thickness greater than or equal to that of the first undoped region. Each of the first undoped region and the first doped region may include a plurality of first unit layers having different energy band gaps, and at least one hole accumulation region configured by arranging the first unit layers such that adjacent ones of the first unit layers have different energy band gaps from each other.

The plurality of first unit layers may include a first layer and a second layer having an energy band gap smaller than an energy band gap of the first layer.

The plurality of first unit layers may include a third layer having an energy band gap greater than an energy band gap of the first layer.

The first layer, the second layer, and the third layer may be a GaN layer, an InGaN layer, and an AlGaN layer, respectively.

At least one of the first undoped region and the first doped region may have a stacked structure of GaN/InGaN/AlGaN/InGaN/GaN.

The first doped region may be contiguous with the second conductivity-type semiconductor layer.

The first doped region may be doped with a second conductivity-type dopant.

A thickness of each of the first unit layers forming the first doped region may range from 0.5 nm to 4.5 nm.

A thickness of each of the first unit layers forming the first undoped region may range from 0.1 nm to 0.5 nm.

At least one of the quantum barrier layers, excluding the quantum barrier layer closest to the second conductivity-type semiconductor layer, among the plurality of quantum barrier layers, may include a second doped region and a second undoped region disposed on the second doped region and having a thickness smaller than or equal to a thickness of the second doped region, and each of the second undoped region and the second doped region may include a plurality of second unit layers having different energy band gaps, and at least one electron accumulation region configured by arranging the second unit layers such that adjacent ones of the second unit layers have different energy band gaps from each other.

The plurality of second unit layers may include a first layer and a second layer having an energy band gap smaller than an energy band gap of the first layer.

The plurality of second unit layers may include a third layer having an energy band gap greater than an energy band gap of the first layer.

The first layer, the second layer, and the third layer may be a GaN layer, an InGaN layer, and an AlGaN layer, respectively.

At least one of the second undoped region and the second doped region may have a stacked structure of GaN/InGaN/AlGaN/InGaN/GaN.

The second doped region may be doped with a first conductivity-type dopant.

A thickness of each of the unit layers forming the second doped region may range from 0.5 nm to 4.5 nm.

A thickness of each of the unit layers forming the second undoped region may range from 0.1 nm to 0.5 nm.

According to another exemplary embodiment of the present incentive concept, a semiconductor light emitting device may include: a first conductivity-type semiconductor layer; an active layer disposed on the first conductivity-type semiconductor layer and including a plurality of quantum well layers and a plurality of quantum barrier layers which are alternately stacked; and a second conductivity-type semiconductor layer disposed on the active layer. At least one of the plurality of quantum barrier layers may include an undoped region and a doped region. The undoped region may include an undoped well layer having an energy band gap smaller than or equal to energy band gaps of the plurality of quantum well layers and a plurality of undoped barrier layers disposed on both sides of the undoped well layer and having an energy band gap greater than an energy band gap of the undoped well layer. The doped region may include a doped well layer having an energy band gap smaller than or equal to energy band gaps of the plurality of quantum well layers and doped barrier layers disposed on both sides of the doped well layer and having an energy band gap greater than an energy band gap of the doped well layer. A thickness of the doped region may be greater than or equal to a thickness of the undoped region.

The doped region may be contiguous with the second conductivity-type semiconductor layer and doped with a second conductivity-type dopant.

According to another exemplary embodiment of the present inventive concept, a semiconductor light emitting device may include: an n-type semiconductor layer; an active layer disposed on the n-type semiconductor layer and including quantum well layers and quantum barrier layers alternately stacked at least one or more times; and a p-type semiconductor layer disposed on the active layer. The quantum barrier layer may include an undoped region and a doped region. The undoped region may include a plurality of undoped barrier layers having different energy band gaps and undoped well layers disposed between the plurality of undoped barrier layers and having energy band gaps smaller than energy band gaps of the plurality of undoped barrier layers. The doped region may include a plurality of doped barrier layers having different energy band gaps and doped well layers disposed between the plurality of doped barrier layers and having energy band gaps smaller than energy band gaps of the plurality of doped barrier layers. A thickness of the doped region may be greater than or equal to an energy band gap of the undoped region.

According to another exemplary embodiment of the present inventive concept, a semiconductor light emitting device may include: a first conductivity-type semiconductor layer; a second conductivity-type semiconductor layer; and an active layer disposed between the first and second conductivity-type semiconductor layers and including a plurality of quantum barrier layers and a plurality of quantum well layers which are alternately stacked. A first quantum barrier layer among the plurality of quantum barrier layers may include an undoped region and a doped region having a thickness greater than or equal to a thickness of the undoped region. Each of the undoped region and the doped region may include a plurality layers having different energy band gaps.

The first quantum barrier layer may be a quantum barrier layer closest to the second conductivity-type semiconductor layer, among the plurality of quantum barrier layers. A distance between the doped region of the first quantum barrier layer and the second conductivity-type semiconductor layer may be less than a distance between the undoped region of the first quantum barrier layer and the second conductivity-type semiconductor layer.

A second quantum barrier layer among the plurality of quantum barrier layers may include an undoped region and a doped region having a thickness greater than or equal to a thickness of the undoped region of the second quantum barrier layer. A distance between the doped region of the second quantum barrier layer and the first conductivity-type semiconductor layer may be less than a distance between the undoped region of the second quantum barrier layer and the first conductivity-type semiconductor layer.

At least one of the undoped region and the doped region may have a stacked structure of GaN/InGaN/AlGaN/InGaN/GaN.

A thickness of each layer forming the doped region may range from 0.5 nm to 4.5 nm, and a thickness of each layer forming the undoped region may range from 0.1 nm to 0.5 nm.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
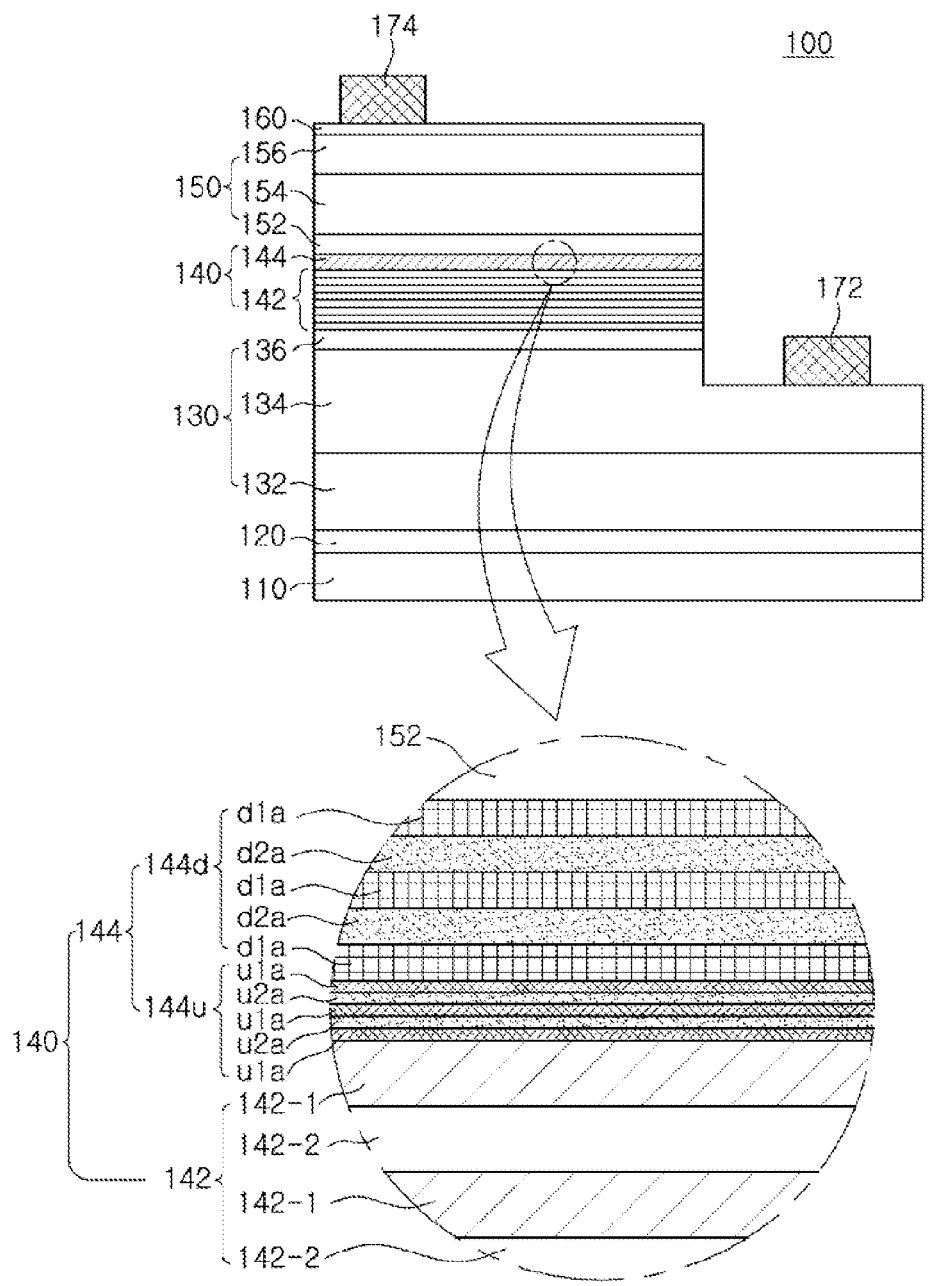
FIG. 1 is a cross-sectional view illustrating a semiconductor light emitting device according to an exemplary embodiment of the present inventive concept.

Hereinafter, exemplary embodiments of the present inventive concept will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

The expression "an exemplary embodiment or one example" used in the present inventive concept does not refer to identical examples and is provided to stress different unique features between each of the examples. However, examples provided in the following description are not excluded from being associated with features of other examples and implemented thereafter. For example, even if matters described in a specific example are not described in a different example thereto, the matters may be understood as being related to the other example, unless otherwise mentioned in descriptions thereof.

In this disclosure, unless otherwise mentioned, terms such as "on", "upper "upper surface", "under", "lower surface", "upward", "downward", "side surface", "high", "low" and the like, are determined based on the drawings, and in actuality, the terms may be changed according to a direction in which a semiconductor light emitting device is disposed. Also, it will be understood that when an element is referred to as being "on" or "beneath" another element, the element can be directly on the other element or indirectly formed with an intervening element therebetween.

FIG. 1 is a cross-sectional view illustrating a semiconductor light emitting device according to an exemplary embodiment of the present inventive concept.

Referring to FIG. 1, a semiconductor light emitting device 100 may include a buffer layer 120 and a first conductivity-type semiconductor layer 130 sequentially disposed on a substrate 110. The first conductivity-type semiconductor layer 130 may be an n-type nitride semiconductor layer. In detail, the first conductivity-type semiconductor layer 130 may include an undoped GaN layer 132, an n-type GaN contact layer 134, and an n-type superlattice layer 136 sequentially disposed.

The substrate 110 is a substrate appropriate for growing a nitride semiconductor single crystal. The substrate 110 may be formed of a transparent material including sapphire and may also be formed of zinc oxide (ZnO), gallium nitride (GaN), gallium arsenide (GaAs), silicon (Si), silicon carbide (SiC), an aluminum nitride (AlN), and the like, in addition to sapphire.

The buffer layer 120 is a layer for enhancing lattice matching with the substrate 110 before the first conductivity-type semiconductor layer 130 is grown on the substrate 110. In general, the buffer layer 120 may be formed of one or more materials among undoped GaN, InGaN, AlN, InN, AlInGaN, SiC, and ZnO. The buffer layer 120 may be omitted according to types of the substrate 110 and growth methods, etc.

The n-type GaN contact layer and the n-type superlattice layer 134 and 136 may have a multilayer structure formed by varying n-type impurity concentrations, or thicknesses or components of the layers. The multilayer structure may include layers having different doping concentrations in a GaN composition, or two or more different layers such as GaN, InGaN, or AlGaN. Alternatively, the multilayer structure may be formed by alternately stacking layers having different impurity concentrations or alternately stacking layers having different thicknesses.

An active layer 140 may be disposed on the first conductivity-type semiconductor layer 130. The active layer 140 may include layers 142 including a plurality of quantum barrier layers 142-2 and a plurality of quantum well layers 142-1 which are alternately stacked and a final quantum barrier layer 144 closest to a second conductivity-type semiconductor layer 150. For example, the active layer 140 may have a multi-quantum well structure in which InGaN layers and GaN layers are alternately stacked or AlGaN layers and GaN layers are alternately stacked. In the active layer 140, the final quantum barrier layer 144 has a different structure from those of the plurality of quantum barrier layers 142-2, so the final quantum barrier layer 144 is denoted by a separate reference numeral so as to be distinguished from the layers 142.

The quantum well layers 142-1 and the quantum barrier layers 142-2 may be Group III nitride-based semiconductor layers. Specifically, the quantum well layers 142-1 and the quantum barrier layers 142-2 may be formed of a material having an empirical formula of $Al_xIn_yGa_zN$, where $0 \leq x,y,z \leq 1$ and $x+y+z>0$. More specifically, the quantum well layers 142-1 may be InGaN layers and the quantum barrier layers 142-2 may be GaN layers.

The final quantum barrier layer 144 may include a first undoped region 144u and a first doped region 144d disposed on the first undoped region 144u.

The first undoped region 144u may be formed by alternately disposing a plurality of first unit layers having different energy band gaps. In detail, the plurality of first unit layers may include first layers u1a of the first undoped region 144u and second layers u2a of the first undoped region 144u having an energy band gap smaller than that of the first layers u1a. Since the second layers u2a of the first undoped region 144u are disposed between each of two first layers u1a of the first undoped region 144u, the regions between each of two first layers u1a of the first undoped region 144u may become hole accumulation regions able to confine holes.

The first doped region 144d may be formed by alternately disposing a plurality of first unit layers having different energy band gaps. In detail, the plurality of first unit layers may include first layers d1a of the first doped region 144d and second layers d2a of the first doped region 144d having an energy band gap smaller than that of the first layers d1a. Since the second layer d2a of the first doped region 144d is disposed between each of two first layers d1a of the first doped region 144d, the regions between each of two first layers d1a of the first doped region 144d may become hole accumulation regions able to confine holes.

A thickness of the final quantum barrier layer 144 may be greater than a thickness of the quantum barrier layer 142-2. Namely, the sum of the thicknesses of the plurality of first unit layers may be greater than the thickness of the quantum barrier layer 142-2. Thus, when the second conductivity-type semiconductor layer 150 is grown at a high temperature after the active layer 140 is grown, transmission of thermal energy to the active layer 140 may be blocked. Also, a degradation of the active layer due to excessive diffusion of a second conductivity-type dopant present in the second conductivity-type semiconductor layer 150 to the interior of the active layer 140 may be prevented. The second conductivity-type dopant may be a p-type dopant and, specifically, may be magnesium (Mg).

A thickness of the first doped region 144d may be greater than or equal to a thickness of the first undoped region 144u. In detail, the thickness of each of the layers forming the first doped region 144d may range from 0.5 nm to 4.5 nm, and the thickness of each of the layers forming the first undoped region 144u may range from 0.1 nm to 0.5 nm. The first doped region 144d may be doped with a second conductivity-type dopant. The second conductivity-type dopant may be a p-type dopant, and specifically, magnesium (Mg).

Excessive diffusion of the second conductivity-type dopant into the active layer 140 will degrade the active layer 140. However, since the second conductivity-type dopant serves as a hole carrier, if the second conductivity-type dopant is appropriately diffused to the active layer 140, the second conductivity-type dopant may help holes to be smoothly injected into the active layer 140. Thus, when the thickness of the first doped region 144d is greater than or equal to the thickness of the first undoped region 144u, diffusion of the second conductivity-type dopant may be appropriately adjusted and hole injection to the active layer 140 may increase, without degrading the active layer 140.

The plurality of first unit layers may be formed of a material having an empirical formula of $Al_xIn_yGa_zN$, where $0 \leq x,y,z \leq 1$ and $x+y+z>0$, for example. Specifically, the first layers u1a and d1a may be GaN layers, and the second layers u2a and d2a may be InGaN layers.

Figure 2:
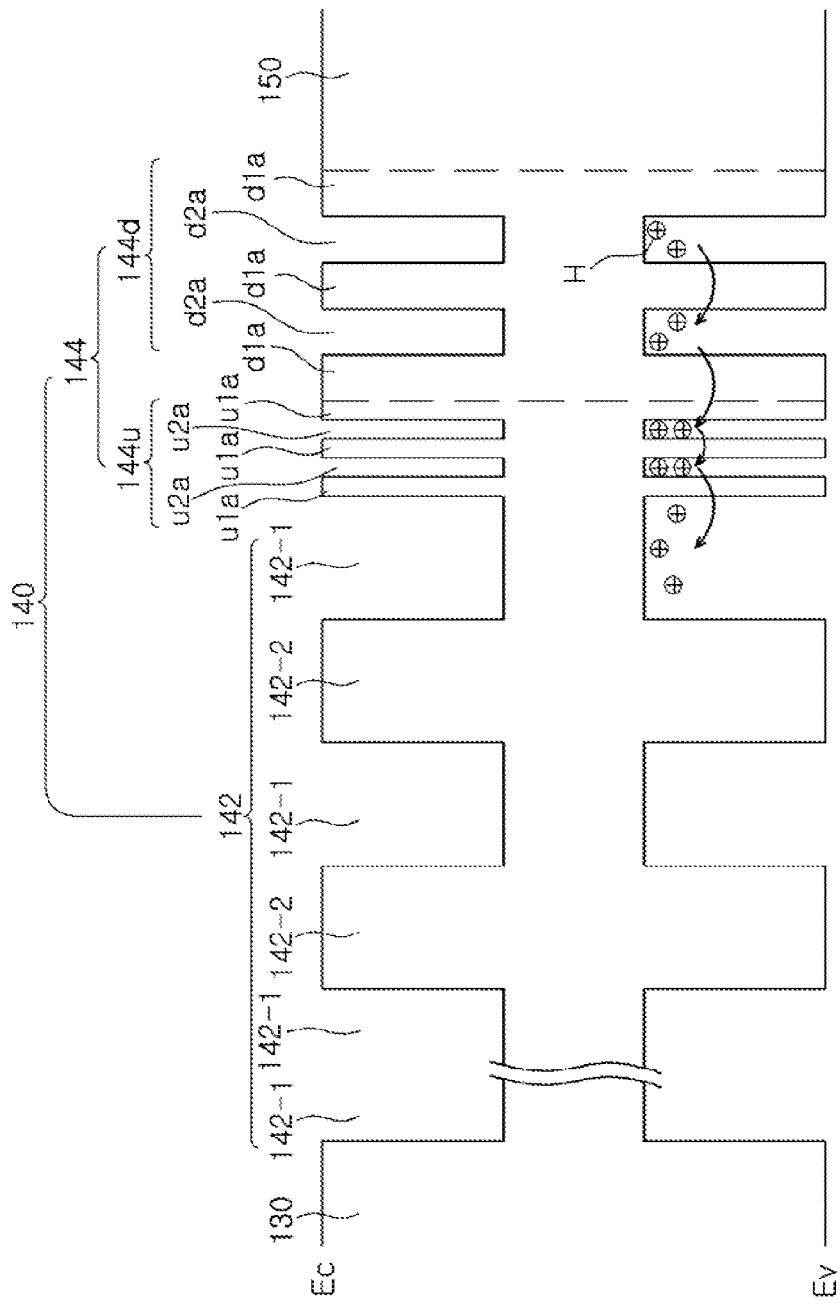
FIG. 2 is an energy band diagram of a semiconductor light emitting device according to an exemplary embodiment of the present inventive concept.

FIG. 2 is an energy band diagram of a semiconductor light emitting device according to an exemplary embodiment of the present inventive concept.

Referring to FIG. 2, an energy band diagram of the first conductivity-type semiconductor layer 130, the second conductivity-type semiconductor layer 150, the quantum well layer 142-1, the quantum barrier layer 142-2, and the final quantum barrier layer 144 is illustrated. In the first undoped region 144u, the second layers u2a of the first undoped region 144u having an energy band gap smaller than that of the first layers u1a may be disposed between each of two first layers u1a of the first undoped region 144u. The regions between the first layers u1a of the first undoped region 144u may serve to confine holes H and supply the holes H to the interior of the active layer 140. In the first doped region 144d, the second layers d2a of the first doped region 144d having an energy band gap smaller than that of the first layers d1a may be disposed between each of two first layers d1a of the first doped region 144d. The regions between the first layers d1a of the first doped region 144d may serve to confine holes H and supply the holes H to the interior of the active layer 140. The injection efficiency of the holes H into the active layer 140 could be reduced due to the thickness of the final quantum barrier layer 144; however, since the final quantum barrier layer 144 has the energy band structure described above, even though the final quantum barrier layer 144 is thick, an excessive reduction in the amount of holes H injected into the active layer 140 may be prevented.

Referring back to FIG. 1, the second conductivity-type semiconductor layer 150 may be disposed on the active layer 140. The second conductivity-type semiconductor layer 150 may be a p-type nitride semiconductor layer. Specifically, the second conductivity-type semiconductor layer 150 may include a p-type superlattice layer 152, a p-type GaN layer 154, and a p-type contact layer 156 which are sequentially disposed.

The p-type GaN layer 154 and the p-type contact layer 156 may be formed as multiple layers by varying p-type impurity concentrations, or thicknesses or components of the layers. For example, multiple p-type layers may be formed by varying several doping concentrations of the GaN component, by stacking two or more layers having different components of GaN, InGaN, and AlGaN, by repeating layers having different impurity concentrations, or by repeating layers having different thicknesses.

The final quantum barrier layer 144 may be contiguous with the second conductivity-type semiconductor layer 150 without any electron blocking layer interposed therebetween. Namely, the final quantum barrier layer 144 may serve to prevent transmission of thermal energy to the active layer 140, increase efficiency in the injection of holes to the active layer 140, and serve as an electron blocking layer preventing electron overflow. Thus, an increase in an operating voltage of the light emitting device due to an electron blocking layer may be prevented.

A transparent electrode layer 160 and/or a second electrode 174 may be disposed on the second conductivity-type semiconductor layer 150. Also, a first electrode 172 may be disposed in a region of the first conductivity-type semiconductor layer 130 exposed through mesa etching. The second conductivity-type semiconductor layer 150 and the active layer 140 may include vias, and an electrode connected to the first conductivity-type semiconductor layer 130 through the vias may be disposed (please refer to FIG. 14). Here, a radius of each via may range from 5 μm to 50 μm and the number of vias may range from 3 to 300.

As a material of the transparent electrode layer 160, a metal oxide-based material such as ITO or ZnO or a graphene-based material may be used. In the case of a semiconductor light emitting device having a flipchip structure, the transparent electrode may be replaced with a reflective electrode, and as the reflective electrode, a metal such as silver (Ag) or aluminum (Al), a distributed Bragg reflector (DBR) including a plurality of stacked layers of $TiO_2$ and $SiO_2$ pairs, or a DBR including a plurality of stacked layers of $SiO_2$ and $Ta_2O_5$ pairs, may be used.

Figure 3:
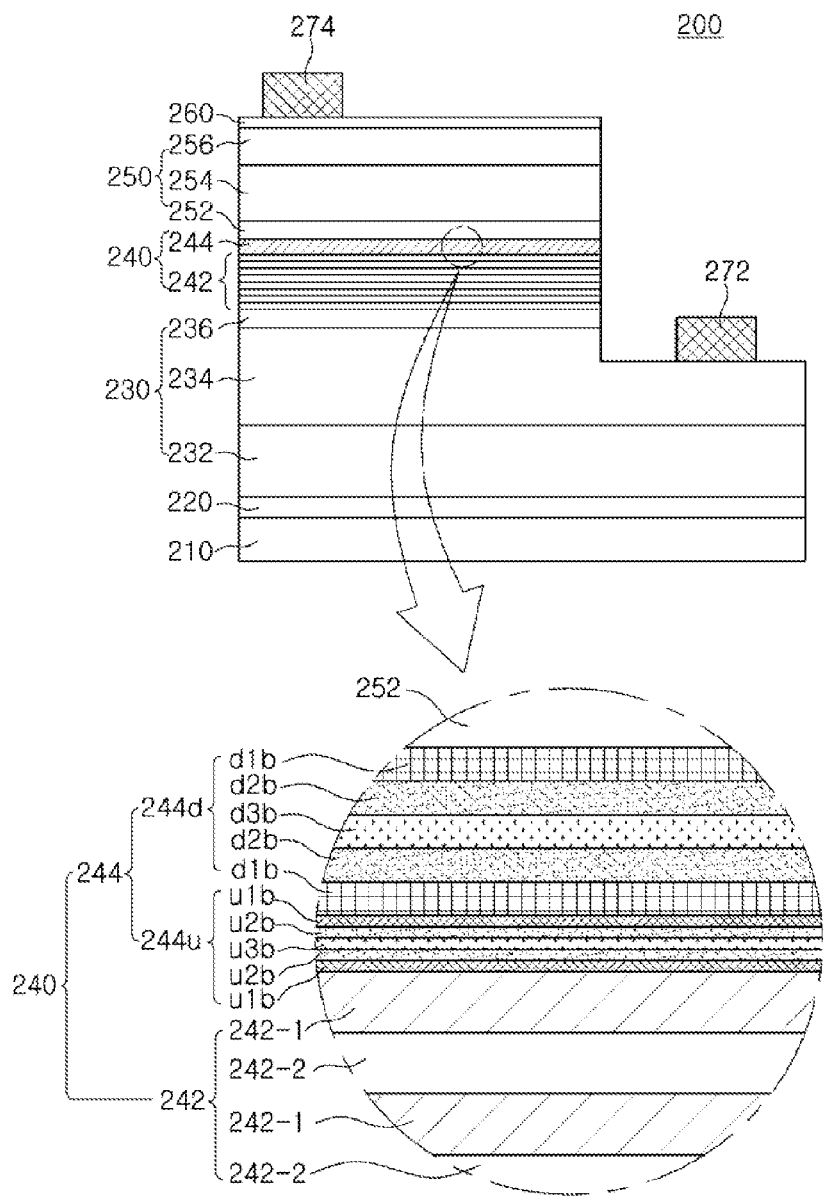
FIG. 3 is a cross-sectional view illustrating a semiconductor light emitting device according to an exemplary embodiment of the present inventive concept.

FIG. 3 is a cross-sectional view illustrating a semiconductor light emitting device according to an exemplary embodiment of the present inventive concept. Hereinafter, descriptions of the same components as those of FIG. 1 will be omitted.

Referring to FIG. 3, a semiconductor light emitting device 200 may include a buffer layer 220 and a first conductivity-type semiconductor layer 230 sequentially disposed on a substrate 210. The first conductivity-type semiconductor layer 230 may be an n-type nitride semiconductor layer. In detail, the first conductivity-type semiconductor layer 230 may include an undoped GaN layer 232, an n-type GaN contact layer 234, and an n-type superlattice layer 236 which are sequentially disposed.

The substrate 210, the buffer layer 220, and the first conductivity-type semiconductor layer 230 may be formed of the same material as that of the substrate 110, the buffer layer 120, and the first conductivity-type semiconductor layer 130 of the semiconductor light emitting device 100 illustrated in FIG. 1.

An active layer 240 may be disposed on the first conductivity-type semiconductor layer 230. The active layer 240 may include layers 242 including a plurality of quantum barrier layers 242-2 and a plurality of quantum well layers 242-1 which are alternately stacked and a final quantum barrier layer 244 closest to a second conductivity-type semiconductor layer 250. The plurality of quantum well layers 242-1 and the plurality of quantum barrier layers 242-2 may be formed of the same material as that of the plurality of quantum well layers 142-1 and the plurality of quantum barrier layers 142-2 of the semiconductor light emitting device 100 illustrated in FIG. 1.

The final quantum barrier layer 244 may include a first undoped region 244u and a first doped region 244d disposed on the first undoped region 244u.

The first undoped region 244u may be formed by alternately disposing a plurality of first unit layers having different energy band gaps. In detail, the plurality of first unit layers may include first layers u1b of the first undoped region 244u, second layers u2b of the first undoped region 244u having an energy band gap smaller than that of the first layers u1b, and a third layer u3b of the first undoped region 244u having an energy band gap greater than that of the first layers u1b. Since the second layers u2b of the first undoped region 244u are disposed between the first layers u1b and the third layer u3b of the first undoped region 244u, the regions between the first layer u1b and the third layer u3b of the first undoped region 244u may become hole accumulation regions able to confine holes.

The first doped region 244d may be formed by alternately disposing a plurality of first unit layers having different energy band gaps. In detail, the plurality of first unit layers may include first layers d1b of the first doped region 244d, a second layer d2b of the first doped region 244d having an energy band gap smaller than that of the first layers d1b, and a third layer d3b of the first doped region 244d having an energy band gap greater than that of the first layers d1b. Since the second layers d2b of the first doped region 244d are disposed between the first layers d1b and the third layer d3b of the first doped region 244d, the regions between the first layers d1b and the third layer d3b of the first doped region 244d may become hole accumulation regions able to confine holes.

A thickness of the final quantum barrier layer 244 may be greater than a thickness of the quantum barrier layer 242-2. Namely, the sum of the thicknesses of the plurality of first unit layers may be greater than the thickness of the quantum barrier layer 242-2.

A thickness of the first doped region 244d may be greater than or equal to a thickness of the first undoped region 244u. In detail, the thickness of each of the layers forming the first doped region 244d may range from 0.5 nm to 4.5 nm, and the thickness of each of the layers forming the first undoped region 244u may range from 0.1 nm to 0.5 nm. The first doped region 244d may be doped with a second conductivity-type dopant.

The plurality of first unit layers may be formed of the same material as that of the plurality of first unit layers of the semiconductor light emitting device 100 illustrated in FIG. 1.

Figure 4:
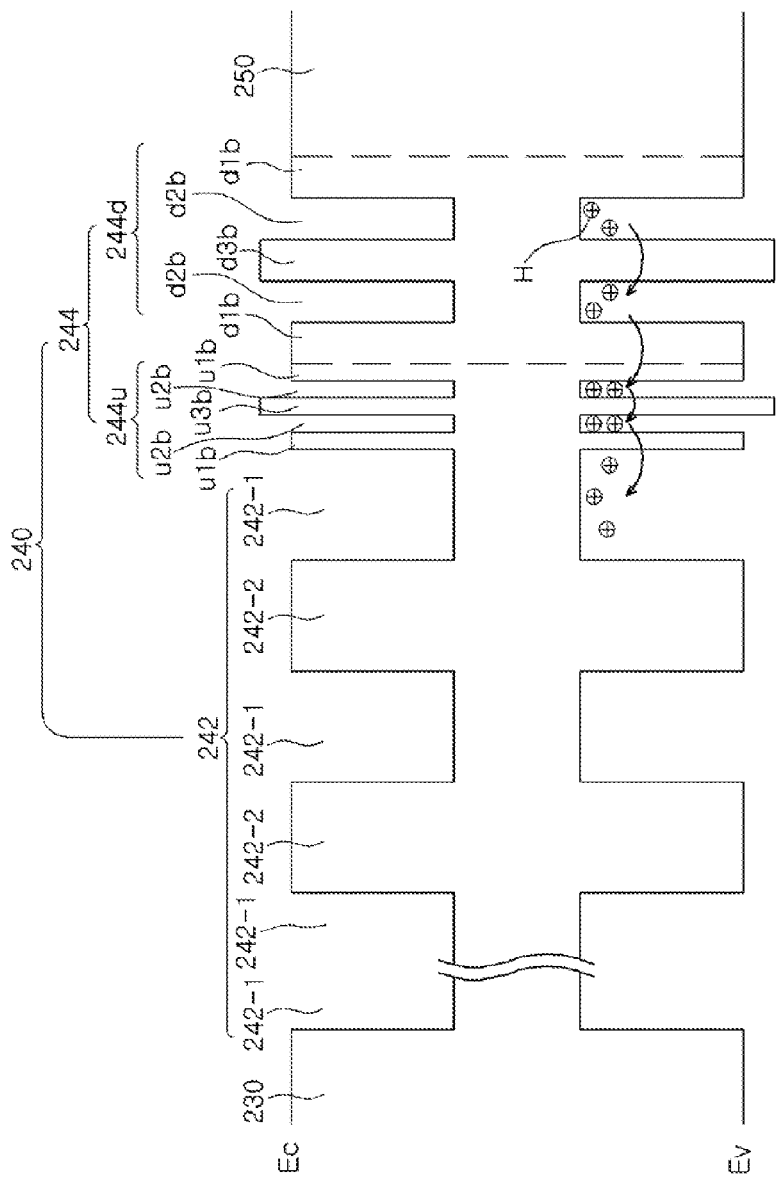
FIG. 4 is an energy band diagram of a semiconductor light emitting device according to an exemplary embodiment of the present inventive concept.

FIG. 4 is an energy band diagram of a semiconductor light emitting device according to an exemplary embodiment of the present inventive concept.

Referring to FIG. 4, an energy band diagram of the first conductivity-type semiconductor layer 230, the second conductivity-type semiconductor layer 250, the quantum well layer 242-1, the quantum barrier layer 242-2, and the final quantum barrier layer 244 is illustrated. In the first undoped region 244u, the second layers u2b of the first undoped region 244u having an energy band gap smaller than those of the first layers u1b and the third layer u3b of the first undoped region 244u may be disposed between each of the first layers u1b and the third layer u3b of the first undoped region 244u. The energy band gap of the third layer u3b of the first undoped region 244u may be greater than that of the first layer u1b of the first undoped region 244u. The regions between the first layers u1b and the third layer u3b of the first undoped region 244u may serve to confine holes H and supply the holes H to the interior of the active layer 240. In the first doped region 244d, the second layers d2b of the first doped region 244d having an energy band gap smaller than those of the first layers d1b and the third layer d3b of the first doped region 244d may be disposed between the first layers d1b and the third layer d3b of the first doped region 244d. The energy band gap of the third layer d3b of the first doped region 244d may be greater than that of the first layers d1b of the first doped region 244d. The regions between the first layers d1b and the third layer d3b of the first doped region 244d may serve to confine holes H and supply the holes H to the interior of the active layer 240.

Referring back to FIG. 3, the second conductivity-type semiconductor layer 250 may be disposed on the active layer 240. The second conductivity-type semiconductor layer 250 may include a p-type superlattice layer 252, a p-type GaN layer 254, and a p-type contact layer 256 which are sequentially disposed. The second conductivity-type semiconductor layer 250 may be formed of the same material as that of the second conductivity-type semiconductor layer 150 of the semiconductor light emitting device 100 illustrated in FIG. 1.

The final quantum barrier layer 244 may be contiguous with the second conductivity-type semiconductor layer 250 without any electron blocking layer interposed therebetween.

A transparent electrode layer 260 and/or a second electrode 274 may be disposed on the second conductivity-type semiconductor layer 250. Also, a first electrode 272 may be disposed in a region of the first conductivity-type semiconductor layer 230 exposed through mesa etching. The second conductivity-type semiconductor layer 250 and the active layer 240 may include vias, and an electrode connected to the first conductivity-type semiconductor layer 230 through the vias may be disposed (please refer to FIG. 14).

The transparent electrode layer 260, the first electrode 272, and the second electrode 274 may be formed of the same material as that of the transparent electrode layer 160, the first electrode 172, and the second electrode 174 of the semiconductor light emitting device 100 illustrated in FIG. 1.

Figure 5:
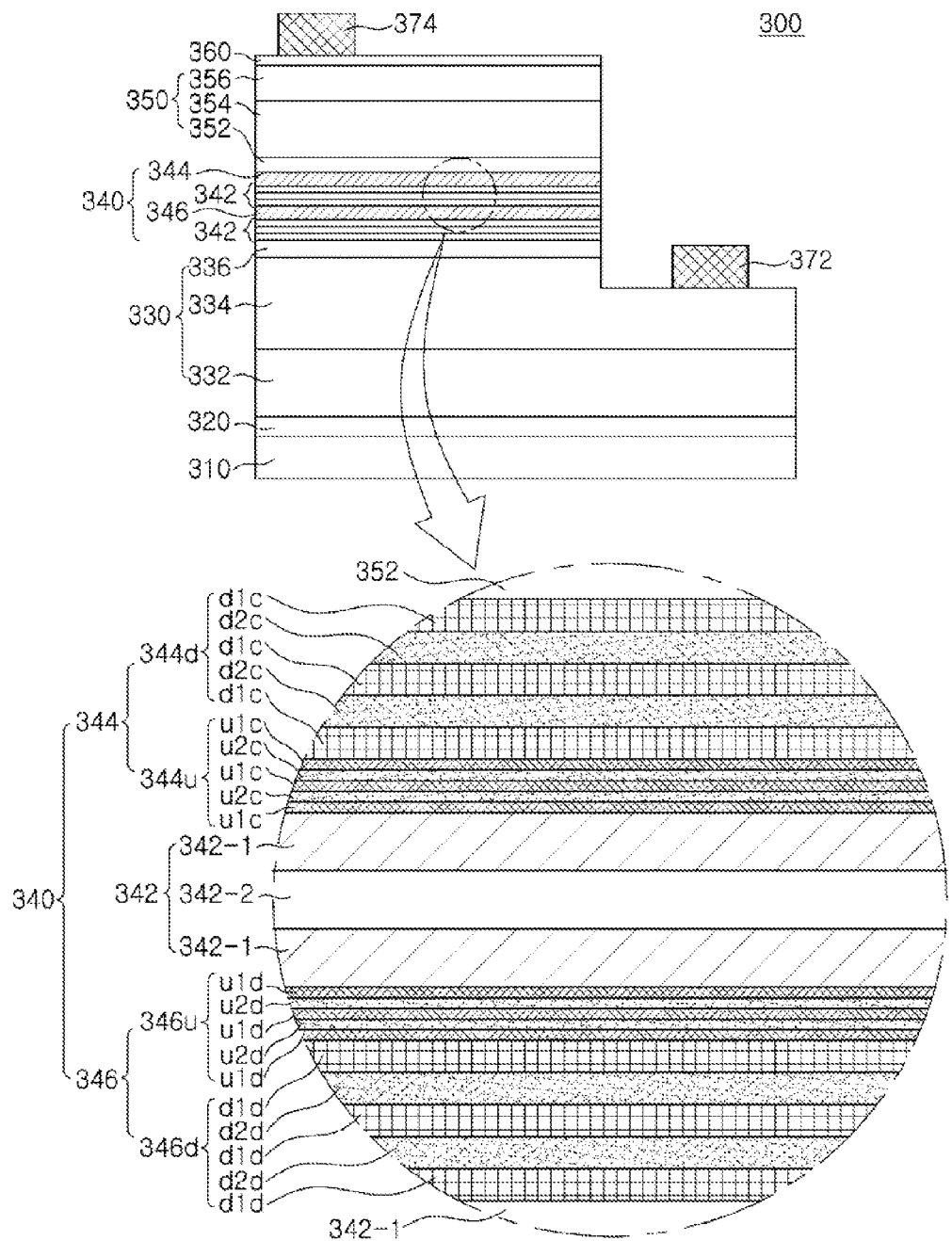
FIG. 5 is a cross-sectional view illustrating a semiconductor light emitting device according to an exemplary embodiment of the present inventive concept.

FIG. 5 is a cross-sectional view illustrating a semiconductor light emitting device according to an exemplary embodiment of the present inventive concept. Hereinafter, descriptions of the same components as those of FIG. 1 will be omitted.

Referring to FIG. 5, a semiconductor light emitting device 300 may include a buffer layer 320 and a first conductivity-type semiconductor layer 330 sequentially disposed on a substrate 310. The first conductivity-type semiconductor layer 330 may be an n-type nitride semiconductor layer. In detail, the first conductivity-type semiconductor layer 330 may include an undoped GaN layer 332, an n-type GaN contact layer 334, and an n-type superlattice layer 336 which are sequentially disposed.

The substrate 310, the buffer layer 320, and the first conductivity-type semiconductor layer 330 may be formed of the same material as that of the substrate 110, the buffer layer 120, and the first conductivity-type semiconductor layer 130 of the semiconductor light emitting device 100 illustrated in FIG. 1.

An active layer 340 may be disposed on the first conductivity-type semiconductor layer 330. The active layer 340 may include a plurality of quantum barrier layers 342-2, a plurality of quantum well layers 342-1, a final quantum barrier layer 344 closest to the second conductivity-type semiconductor layer 350, and at least one internal quantum barrier layer 346 including an electron accumulation region, with the quantum well layers 342-1 disposed on both sides thereof. The plurality of quantum well layers 342-1 and the plurality of quantum barrier layers 342-2 may be formed of the same material as that of the plurality of quantum well layers 142-1 and the plurality of quantum barrier layers 142-2 of the semiconductor light emitting device 100 illustrated in FIG. 1.

The final quantum barrier layer 344 may include a first undoped region 344u and a first doped region 344d disposed on the first undoped region 344u.

The first undoped region 344u may be formed by alternately disposing a plurality of first unit layers having different energy band gaps. In detail, the plurality of first unit layers may include first layers u1c of the first undoped region 344u and second layers u2c of the first undoped region 344u having an energy band gap smaller than that of the first layers u1c. Since the second layers u2c of the first undoped region 344u are disposed between each of two first layers u1c of the first undoped region 344u, the regions between each of two first layers u1c of the first undoped region 344u may become hole accumulation regions able to confine holes.

The first doped region 344d may be formed by alternately disposing a plurality of first unit layers having different energy band gaps. In detail, the plurality of first unit layers may include first layers d1c of the first doped region 344d and second layers d2c of the first doped region 344d having an energy band gap smaller than that of the first layers d1c. Since the second layers d2c of the first doped region 344d are disposed between each of two first layers d1c of the first doped region 344d, the regions between each of two first layers d1c of the first doped region 344d may become hole accumulation regions able to confine holes.

A thickness of the final quantum barrier layer 344 may be greater than a thickness of the quantum barrier layer 342-2. Namely, the sum of the thicknesses of the plurality of first unit layers may be greater than the thickness of the quantum barrier layer 342-2.

A thickness of the first doped region 344d may be greater than or equal to a thickness of the first undoped region 344u. In detail, the thickness of each of the layers forming the first doped region 344d may range from 0.5 nm to 4.5 nm, and the thickness of each of the layers forming the first undoped region 344u may range from 0.1 nm to 0.5 nm. The first doped region 344d may be doped with a second conductivity-type dopant.

The plurality of first unit layers may be formed of the same material as that of the plurality of first unit layers of the semiconductor light emitting device 100 illustrated in FIG. 1.

The internal quantum barrier layer 346 may include a second doped region 346d and a second undoped region 346u disposed on the second doped region 346d. The second doped region 346d may be doped with a first conductivity-type dopant. The first conductivity-type dopant may be an n-type dopant.

The second undoped region 346u may be formed by alternately disposing a plurality of second unit layers having different energy band gaps. In detail, the plurality of second unit layers may include first layers u1d of the second undoped region 346u and second layers u2d of the second undoped region 346u having an energy band gap smaller than that of the first layers u1d. Since the second layers u2d of the second undoped region 346u are disposed between each of two first layers u1d of the second undoped region 346u, the regions between each of two first layers u1d of the second undoped region 346u may become electron accumulation regions able to confine electrons.

The second doped region 346d may be formed by alternately disposing a plurality of second unit layers d1d and d2d having different energy band gaps. In detail, the plurality of second unit layers d1d and d2d may include first layers d1d of the second doped region 346d and second layers d2d of the second doped region 346d having an energy band gap smaller than that of the first layers d1d. Since the second layers d2d of the second doped region 346d are disposed between each of two first layers d1d of the second doped region 346d, the regions between each of two first layers d1d of the second doped region 346d may become electron accumulation regions able to confine electrons.

A thickness of the internal quantum barrier layer 346 may be greater than a thickness of the quantum barrier layer 342-2. Namely, the sum of the thicknesses of the plurality of second unit layers may be greater than the thickness of the quantum barrier layer 342-2. Thus, electron overflow due to mobility thereof faster than that of holes can be prevented.

A thickness of the second doped region 346d may be greater than or equal to a thickness of the second undoped region 346u. In detail, the thickness of each of the layers forming the second doped region 346d may range from 0.5 nm to 4.5 nm, and the thickness of each of the layers forming the second undoped region 346u may range from 0.1 nm to 0.5 nm.

The plurality of second unit layers may be formed of a material having an empirical formula of $Al_xIn_yGa_zN$, where $0 \leq x,y,z \leq 1$, and $x+y+z>0$. In detail, the first layers u1d and d1d may be GaN layers, and the second layers u2d and d2d may be InGaN layers.

Figure 6:
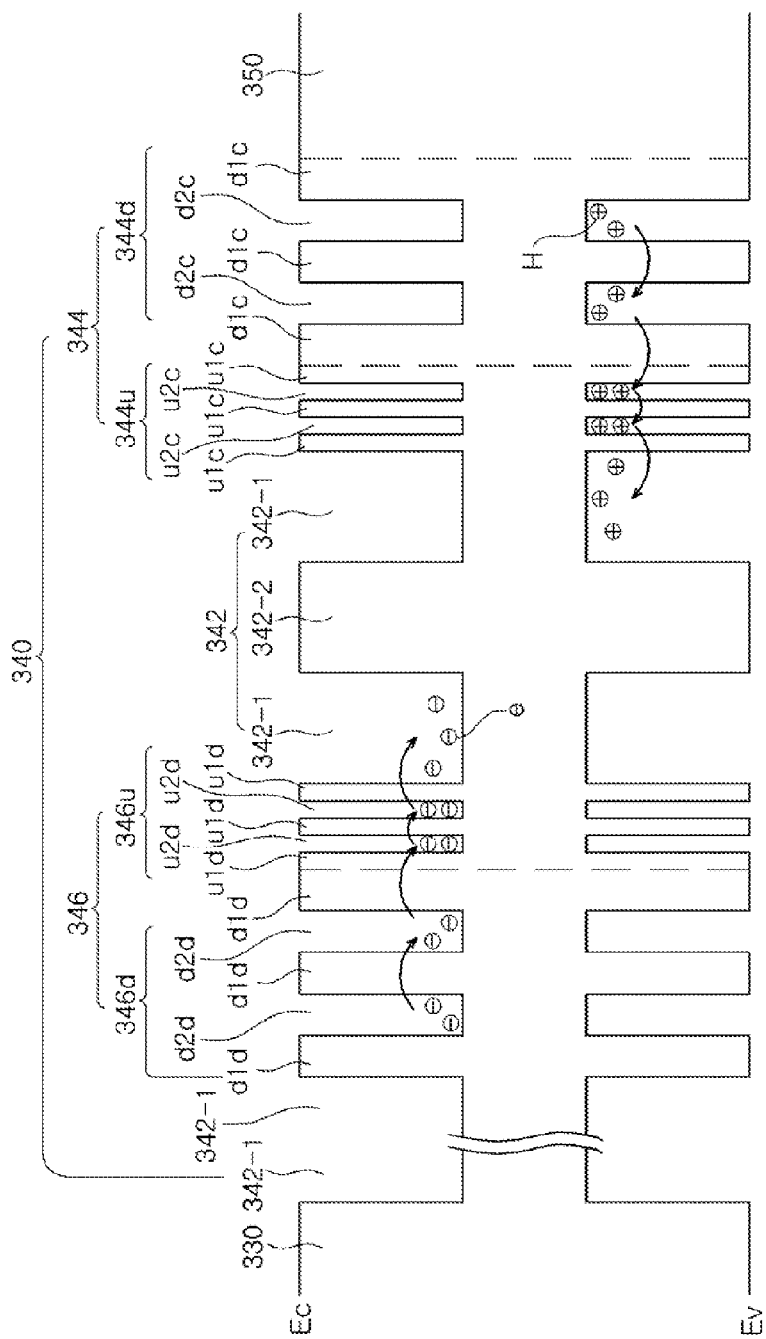
FIG. 6 is an energy band diagram of a semiconductor light emitting device according to an exemplary embodiment of the present inventive concept.

FIG. 6 is an energy band diagram of a semiconductor light emitting device according to an exemplary embodiment of the present inventive concept.

Referring to FIG. 6, an energy band diagram of the first conductivity-type semiconductor layer 330, the second conductivity-type semiconductor layer 350, the quantum well layer 342-1, the quantum barrier layer 342-2, the final quantum barrier layer 344, and the internal quantum barrier layer 346 is illustrated.

In the first undoped region 344u, the second layers u2c of the first undoped region 344u having an energy band gap smaller than that of the first layers u1c may be disposed between each of two first layers u1c of the first undoped region 344u. The regions between the first layers u1c of the first undoped region 344u may serve to confine holes H and supply the holes H to the interior of the active layer 340.

In the first doped region 344d, the second layers d2c of the first doped region 344d having an energy band gap smaller than that of the first layers d1c may be disposed between the first layers d1c of the first doped region 344d. The regions between the first layers d1c of the first doped region 344d may serve to confine holes H and supply the holes H to the interior of the active layer 340.

In the second undoped region 346u, the second layers u2d of the second undoped region 346u having an energy band gap smaller than that of the first layers u1d may be disposed between each of two first layers u1d of the second undoped region 346u. The regions between the first layers u1d of the second undoped region 346u may serve to confine electrons e and supply the electrons e to the interior of the active layer 340.

In the second doped region 346d, the second layers d2d of the first doped region 346d having an energy band gap smaller than that of the first layers d1d may be disposed between the first layers d1d of the second doped region 346d. The regions between the first layers d1d of the second doped region 346d may serve to confine electrons e and supply the electrons e to the interior of the active layer 340.

Referring back to FIG. 5, the second conductivity-type semiconductor layer 350 may be disposed on the active layer 340. The second conductivity-type semiconductor layer 350 may be a p-type nitride semiconductor layer. Specifically, the second conductivity-type semiconductor layer 350 may include a p-type superlattice layer 352, a p-type GaN layer 354, and a p-type contact layer 356 which are sequentially disposed. The second conductivity-type semiconductor layer 350 may be formed of the same material as that of the second conductivity-type semiconductor layer 150 of the semiconductor light emitting device 100 illustrated in FIG. 1.

A transparent electrode layer 360 and/or a second electrode 374 may be disposed on the second conductivity-type semiconductor layer 350. Also, a first electrode 372 may be disposed in a region of the first conductivity-type semiconductor layer 330 exposed through mesa etching. The second conductivity-type semiconductor layer 350 and the active layer 340 may include vias, and an electrode connected to the first conductivity-type semiconductor layer 330 through the vias may be disposed. Here, a radius of each via may range from 5 μm to 50 μm, and the number of vias may range from 3 to 300.

The transparent electrode layer 360, the first electrode 372, and the second electrode 374 may be formed of the same material as that of the transparent electrode layer 160, the first electrode 172, and the second electrode 174 of the semiconductor light emitting device 100 illustrated in FIG. 1.

Figure 7:
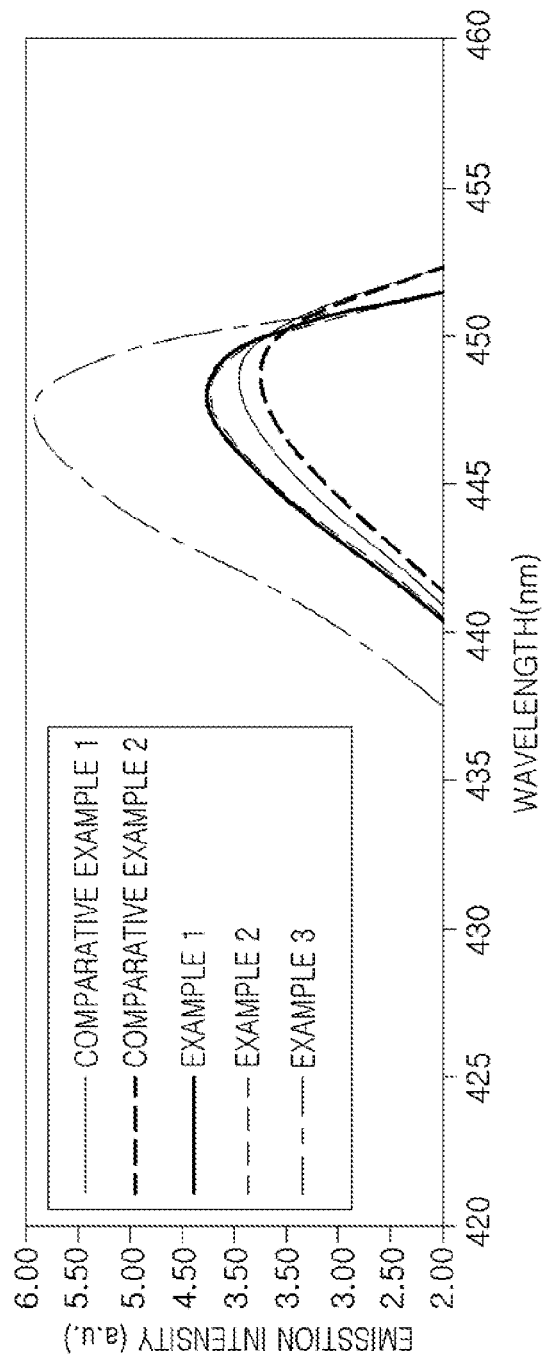
FIG. 7 is a graph illustrating changes in emission intensity according to emission wavelengths of semiconductor light emitting devices according to Examples and Comparative Examples.

FIG. 7 is a graph illustrating changes in emission intensity according to emission wavelengths of semiconductor light emitting devices of Examples 1 to 3 and Comparative Examples 1 and 2 through simulation.

In Example 1, an electron blocking layer was interposed between the final quantum barrier layer 144 and the second conductivity-type semiconductor layer 150 in the semiconductor light emitting device 100 illustrated in FIG. 1. Example 2 is the semiconductor light emitting device 100 illustrated in FIG. 1. In Example 3, all the quantum barrier layers, excluding the final quantum barrier layer 344, were replaced with the internal quantum barrier layers 346 in the semiconductor light emitting device 300 illustrated in FIG. 5. In Comparative Example 1, an electron blocking layer was interposed between the final quantum barrier layer 144 and the second conductivity-type semiconductor layer 150, and the final quantum barrier layer 144 was replaced with the quantum barrier layer 142-2 in the semiconductor light emitting device 100 illustrated in FIG. 1. In Comparative Example 2, the final quantum barrier layer 144 was replaced with the quantum barrier layer 142-2 in the semiconductor light emitting device 100 illustrated in FIG. 1.

Referring to FIG. 7, it can be seen that peak emission intensity of Examples 1 through 3 employing the final quantum barrier layer 144 (please refer to FIG. 1) is higher than those of Comparative Examples 1 and 2 without the final quantum barrier layer 144 (please refer to FIG. 1). Also, it can be seen that Example 3, which further includes the internal quantum barrier layer 346 (please refer to FIG. 5), has even higher peak emission intensity.

Table 1 shows the results of simulating emission intensities and operating voltages of Examples 1 to 3 and Comparative Examples 1 and 2.

TABLE 1

|  | Comparative Example 1 | Comparative Example 2 | Example 1 | Example 2 | Example 3 |
| --- | --- | --- | --- | --- | --- |
| Peak emission intensity (A.U.) | 3.96 | 3.75 | 4.25 | 4.23 | 5.90 |

TABLE 1-continued

|  | Comparative Example 1 | Comparative Example 2 | Example 1 | Example 2 | Example 3 |
| --- | --- | --- | --- | --- | --- |
| Operating voltage (V) | 3.412 | 3.355 | 3.365 | 3.302 | 3.360 |

In Table 1, referring to comparison between Example 1 and Example 2, it can be seen that, when the final quantum barrier layer 144 (please refer to FIG. 1) is employed, peak emission intensity increases, compared with Comparative Examples 1 and 2, and Example 2 without the electron blocking layer has an operating voltage lower than that of Example 1. Thus, it can be seen that, when the final quantum barrier layer 144 (please refer to FIG. 1) is employed, both effects of increasing peak emission intensity and lowering the operating voltage may be obtained.

Figure 8:
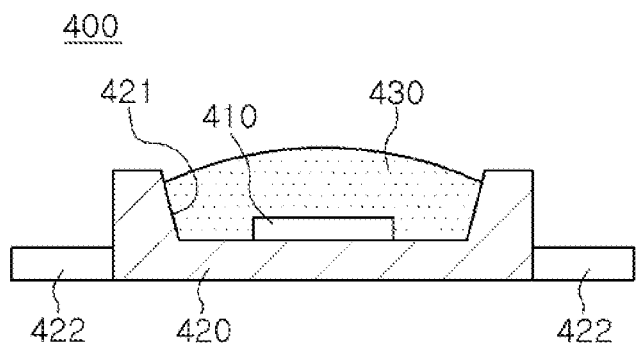
FIGS. 8 and 9 are cross-sectional views illustrating a light emitting device package employing a semiconductor light emitting device according to exemplary embodiments of the present inventive concept.

FIG. 8 is a view schematically illustrating a light emitting device package employing a light emitting device according to an exemplary embodiment of the present inventive concept.

Referring to FIG. 8, a light emitting device package 400 may have a package structure in which a light emitting device 410 according to an exemplary embodiment is mounted within a body 420 having a reflective cup 421.

The body 420 may be a base member on which the light emitting device 410 is supportedly mounted, and may be formed of a white molding compound having a high degree of light reflectivity. This may bring about an effect of increasing a quantity of outwardly emitted light by reflecting light emitted from the light emitting device 410. The white molding compound may include thermosetting resins or silicone resins having high heat resistance. Also, white pigment, a filler, a curing agent, a releasing agent, an antioxidant, an adhesive improver, and the like, may be added to the thermosetting resins. Also, the body 420 may be formed of FR-4, CEM-3, an epoxy, ceramics, and the like. Also, the body 420 may be formed of a metal such as aluminum (Al).

The body 420 may include a lead frame 422 for an electrical connection to an external power source. The lead frame 422 may be formed of a material having excellent electrical conductivity, for example, a metal such as aluminum (Al) or copper (Cu). When the body 420 is formed of a metal, an insulating material may be interposed between the body 420 and the lead frame 422.

The reflective cup 421 provided in the body 420 may have a bottom surface on which the light emitting device 410 is mounted, from which the lead frame 422 may be exposed. The light emitting device 410 may be electrically connected to the exposed lead frame 422.

A size of the cross-section of the reflective cup 421 exposed from an upper surface of the body 420 may be greater than a size of the bottom surface of the reflective cup 421. Here, the cross-section of the reflective cup 421 exposed from the upper surface of the body 420 may define a light emitting surface of the light emitting device 410.

The light emitting device 410 may be sealed by an encapsulant 430 formed within the reflective cup 421 of the body 420. The encapsulant 430 may contain a wavelength conversion material.

For example, at least one or more types of phosphors emitting light having different wavelengths upon being excited by light generated by the light emitting device 410 may be contained as a wavelength conversion material.

Accordingly, light in various colors including white light may be adjusted to be emitted.

For example, when the light emitting device 410 emits blue light, the light emitting device package 400 including at least one among yellow, green, and red phosphors may emit white light of various color temperatures according to mixture ratios of the phosphors. Alternatively, when the light emitting device package 400 includes a light emitting device 410 to which a green or red phosphor is applied, the light emitting device package 400 may emit green or red light. The light emitting device package 400 emitting white light and the package emitting green or red light may be combined to adjust a color temperature and a color rendering index (CRI) of white light. Also, the light emitting device package 400 may include at least one of light emitting devices emitting purple light, blue light, green light, red light, and infrared light. Also, if necessary, the light emitting device 410 may generate visible light having purple, blue, green, red, orange colors, or infrared light to adjust a color according to a surrounding atmosphere or mood. Also, the light emitting device 410 may generate light having a special wavelength stimulating plant growth.

In the present exemplary embodiment, the light emitting device package 400 has the package structure in which the light emitting device 410 is provided within the body 420 having the reflective cup 421, but the structure of the light emitting device package 400 is not limited thereto. Also, in the present exemplary embodiment, a light emitting device package 400 is illustrated as a single package, but the light emitting device package 400 is not limited thereto. For example, the light emitting device package 400 may be the light emitting device 410 itself.

Figure 9:
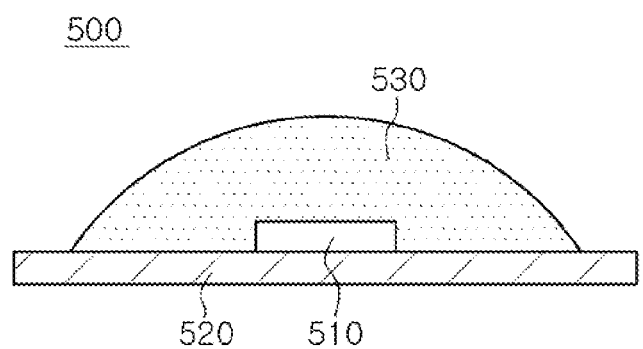

FIG. 9 is a view illustrating a light emitting device package 500 including a light emitting device according to an exemplary embodiment of the present inventive concept. Hereinafter, descriptions of the same components as those of the exemplary embodiment of FIG. 8 will be omitted.

The light emitting device package 500 may have a chip-on-board (COB) structure in which a light emitting device 510 is mounted on an upper surface of a body 520. In this case, the body 520 may be a circuit board with a circuit wiring formed thereon, and an encapsulant 530 may have a lens structure protruding from an upper surface of the body 520 to cover the light emitting device 510. The encapsulant 530 and a wavelength conversion material contained in the encapsulant 530 may be the same as that of the encapsulant 430 illustrated in FIG. 8.

Figure 10:
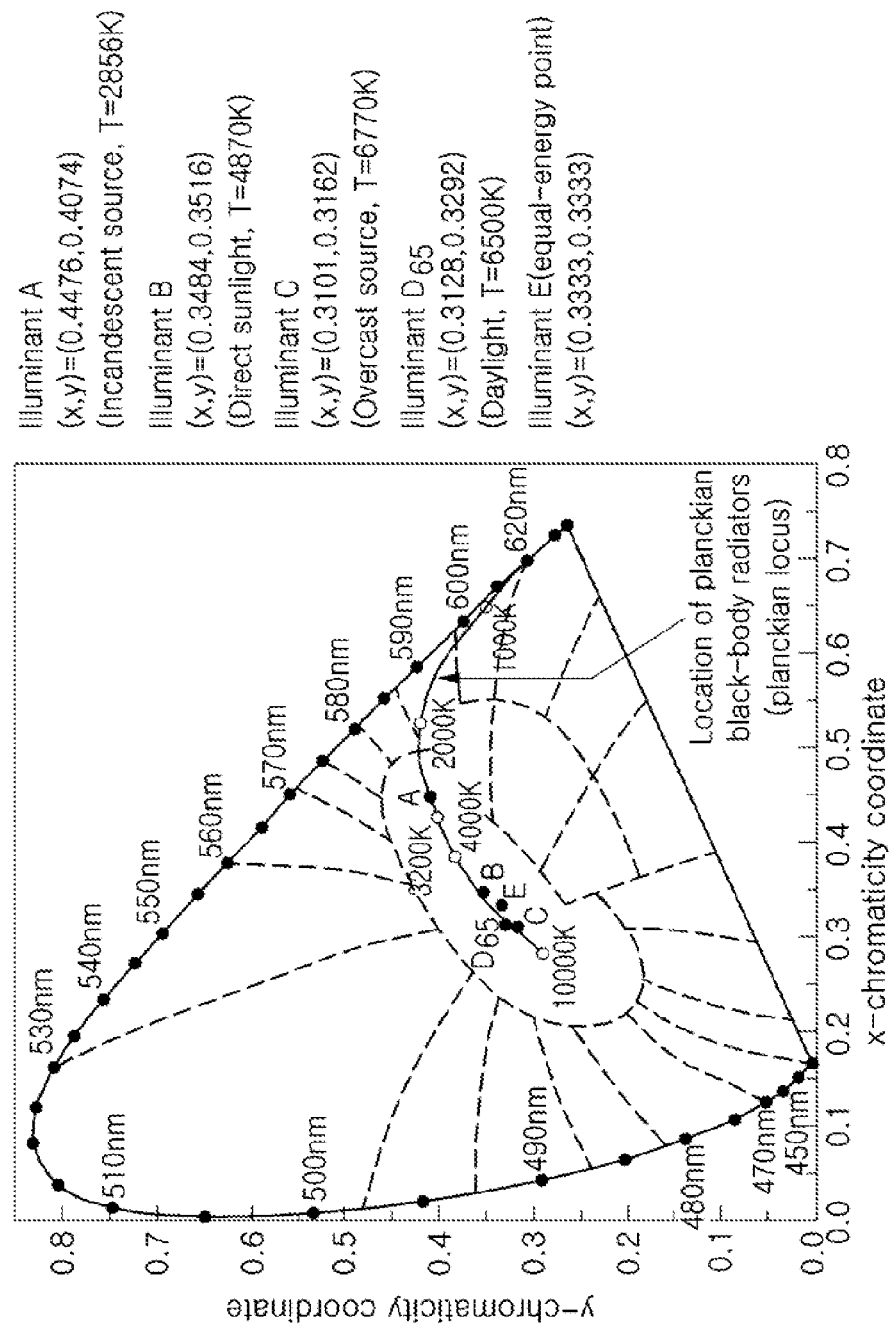
FIG. 10 is a CIE 1931 color space chromaticity diagram.

FIG. 10 is a CIE 1931 color space chromaticity diagram.

Referring to FIG. 10, white light emitted from a light emitting device formed by combining yellow, green, and red phosphors to UV or blue light emitting device or light emitting devices formed by combining green and red light emitting device to a UV or blue light emitting device may have two or more peak wavelengths. In the CIE 1931 color space chromaticity diagram illustrated in FIG. 10, (x, y) coordinates may be positioned in a segment linking (0.4476, 0.4074), (0.3484, 0.3516), (0.3101, 0.3162), (0.3128, 0.3292), (0.3333, 0.3333) or may be positioned in a region surrounded by the segment and a spectrum of black body radiation. A color temperature of the white light corresponds to a range from about 2,000K to about 20,000K.

Figure 11:
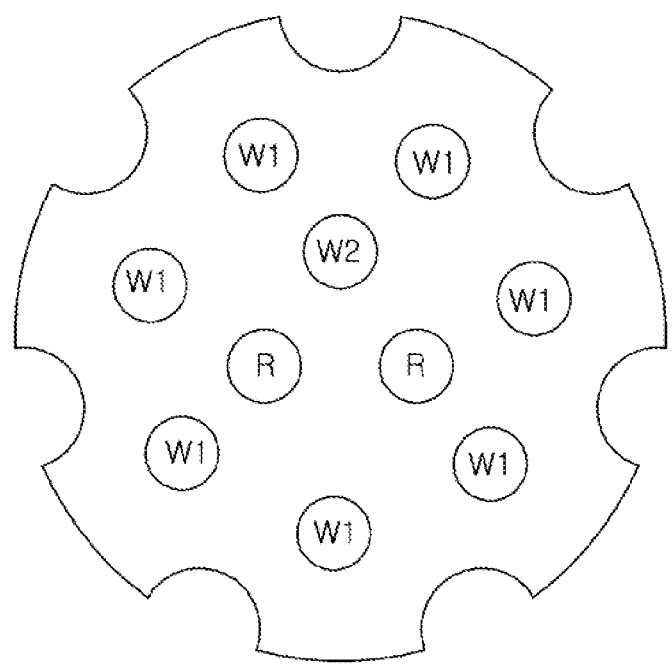
FIGS. 11 and 12 are plan views illustrating various examples of a light source module employable in a lighting device according to an exemplary embodiment of the present inventive concept.

FIG. 11 is a view illustrating a light source module that may be employed in a lighting device according to an exemplary embodiment of the present inventive concept.

Referring to FIG. 11, white light emitting device packages W1 having a color temperature equal to 4,000K, and a white light emitting device package W2 having a color temperature equal to 3,000K and red light emitting device packages R are disposed within a white light emitting package module. The light emitting device packages may be combined to adjust a color temperature to have a range from 2,000K to 4,000K and manufacture a white light emitting package module having a CRI ranging from 85 to 99. The module may be used in a bulb-type lamp of FIG. 16, or the like.

Figure 12:
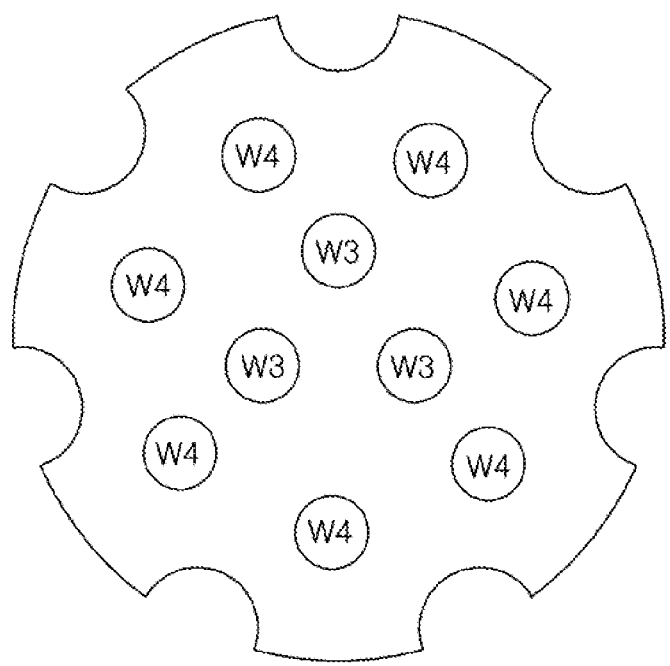

FIG. 12 is a view illustrating a light source module that may be employed in a lighting device according to an exemplary embodiment of the present inventive concept.

Referring to FIG. 12, white light emitting device packages W3 having a color temperature equal to 5,000K and white light emitting device packages W4 having a color temperature 2,700K are disposed within a white light emitting package module. The light emitting device packages may be combined to adjust a color temperature to have a range from 2,700K to 5,000K and manufacture a white light emitting package module having a CRI ranging from 85 to 99. The module may be used in a bulb-type lamp of FIG. 16, or the like.

The number of light emitting device packages may vary according to basic color temperature set values. When a basic color temperature set value is about 4,000K, the number of light emitting device packages having a color temperature equal to 4,000K may be greater than the number of light emitting device packages having a color temperature equal to 3,000K or the number of red light emitting device packages.

One or more of either a phosphor layer or quantum dots (QD) may be disposed on the first or second conductivity-type semiconductor layer.

Phosphors may have the following empirical formulas and colors:

Oxides: Yellow and green $Y_3Al_5O_{12}$:Ce, $Tb_3Al_5O_{12}$:Ce, $Lu_3Al_5O_{12}$:Ce Silicates: Yellow and green $(Ba,Sr)_2SiO_4$:Eu, yellow and orange $(Ba,Sr)_3SiO_5$:Ce Nitrides: Green $\beta$-SiAlON:Eu, yellow $La_3Si_6N_{11}$:Ce, orange $\alpha$-SiAlON:Eu, red $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$, where $0.5 \leq x \leq 3$, $0 < z < 0.3$, and $0 < y \leq 4$. (Here Ln may be at least one type of element selected from the group consisting of Group IIIa elements and rare earth elements and M may be at least one type of element selected from the group consisting of calcium (Ca), barium (Ba), strontium (Sr), and magnesium (Mg).)

Fluorides: KSF-based red $K_2SiF_6$:$Mn^{4+}$, $K_2TiF_6$:$Mn^{4+}$, $NaYF_4$:$Mn^{4+}$, $NaGdF_4$:$Mn^{4+}$ Phosphor compositions should basically conform with stoichiometry, and each element may be substituted with different elements of each group of the periodic table. For example, strontium (Sr) may be substituted with barium (Ba), calcium (Ca), magnesium (Mg), and the like, of alkali earths (II), and yttrium (Y) may be substituted with terbium (Tb), lutetium (Lu), scandium (Sc), gadolinium (Gd), and the like. Also, europium (Eu), an activator, may be substituted with cerium (Ce), terbium (Tb), praseodymium (Pr), erbium (Er), ytterbium (Yb), and the like, according to desired energy levels, and an activator may be applied alone, or a coactivator, or the like, may be additionally applied to change characteristics.

Also, materials such as quantum dots, or the like, may be applied as phosphor alternatives, and phosphors and quantum dots may be used in combination or alone.

A quantum dot may have a structure including a core (having a radius ranging from 1 nm to 10 nm) such as CdSe or InP, a shell (having a thickness ranging from 0.5 nm to 2 nm) such as ZnS or ZnSe, and a ligand for stabilizing the core and the shell, and may realize various colors according to sizes.

Table 2 below illustrates types of phosphors according to applications fields of white light emitting devices using a UV light emitting device chip (wavelength: 220 nm to 440 nm or a blue light emitting device chip (wavelength: 440 nm to 480 nm).

TABLE 2

| Purpose | Phosphor |
| --- | --- |
| TV BLU | β-SiAlON:$Eu^{2+}$, (Ca, Sr)AlSiN$_3$:$Eu^{2+}$, $La_3Si_6N_{11}$:$Ce^{3+}$, $K_2SiF_6$:$Mn^{4+}$, $SrLiAl_3N_4$:Eu, $Ln_{4-x}$ $(Eu_zM_{1-z})_xSi_{12-y}Al_yO_{3+x+y}N_{18-x-y}$ (0.5 ≤ x ≤ 3, 0 < z < 0.3, |
| Lighting | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$ |
| Side Viewing (Mobile Device, Notebook | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, (Sr, Ba, Ca, Mg)$_2$SiO$_4$:$Eu^{2+}$, $K_2SiF_6$:$Mn^{4+}$, $SrLiAl_3N_4$:Eu, $Ln_{4-x}$ $(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$ |
| Electrical component (Headlamp, etc.) | $Lu_3Al_5O_{12}$:$Ce^{3+}$, Ca-α-SiAlON:$Eu^{2+}$, $La_3Si_6N_{11}$:$Ce^{3+}$, (Ca, Sr)AlSiN$_3$:$Eu^{2+}$, $Y_3Al_5O_{12}$:$Ce^{3+}$, $K_2SiF_6$:$Mn^{4+}$, $SrLiAl_3N_4$:Eu, $Ln_{4-x}(Eu_zM_{1-z})_xSi_{12-y}Al_yO_{3+x+y}N_{18-x-y}$ (0.5 ≤ x ≤ 3, 0 < z < 0.3, 0 < y ≤ 4), $K_2TiF_6$:$Mn^{4+}$, $NaYF_4$:$Mn^{4+}$, $NaGdF_4$:$Mn^{4+}$ |

Figure 13:
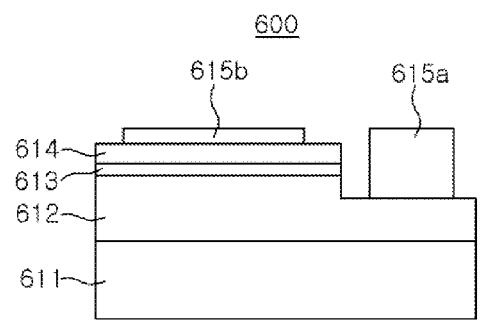
FIGS. 13 through 15 are cross-sectional views illustrating various examples of light emitting diode (LED) chips employable in a light emitting device according to an exemplary embodiment of the present inventive concept.
Figure 14:
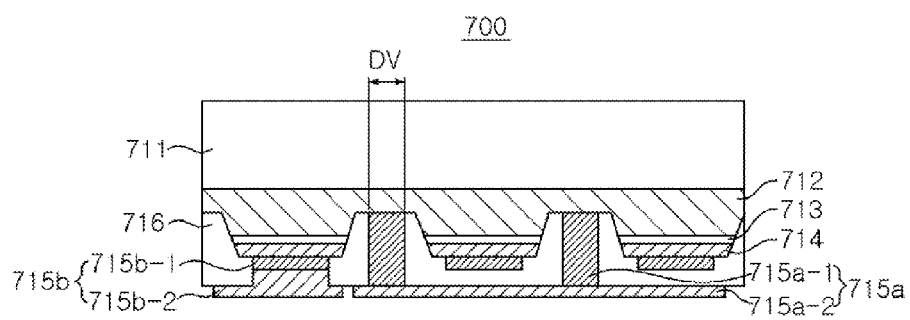
Figure 15:
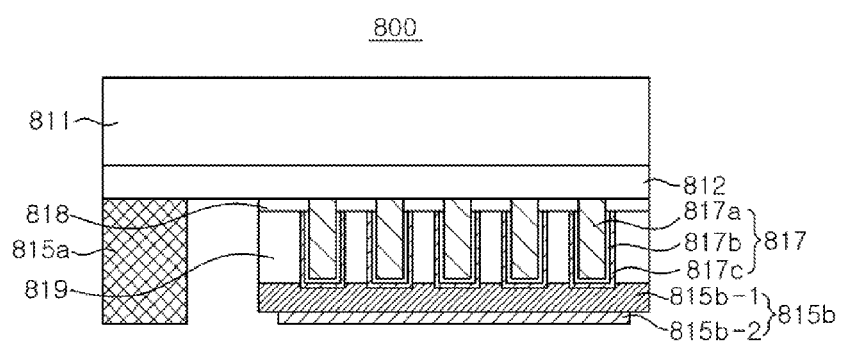

FIGS. 13 through 15 are cross-sectional views illustrating various examples of a light emitting device according to an exemplary embodiment of the present inventive concept.

Referring to FIG. 13, a light emitting device 600 may include a first conductivity-type semiconductor layer 612, an active layer 613, and a second conductivity-type semiconductor layer 614 sequentially stacked on a growth substrate 611.

The first conductivity-type semiconductor layer 612 stacked on the growth substrate 611 may be an n-type nitride semiconductor layer doped with an n-type impurity. The second conductivity-type semiconductor layer 614 may be a p-type nitride semiconductor layer doped with a p-type impurity. However, according to exemplary embodiments, positions of the first and second conductivity-type semiconductor layers 612 and 614 may be interchanged so as to be stacked.

The active layer 613 disposed between the first and second conductivity-type semiconductor layers 612 and 614 emits light having a predetermined level of energy through electron-hole recombination. The active layer 613 may include a material having an energy band gap smaller than those of the first and second conductivity-type semiconductor layers 612 and 614. Also, the active layer 613 may have a multi-quantum well (MQW) structure in which quantum well layers and quantum barrier layers are alternately stacked. However, without being limited thereto, the active layer 613 may have a single quantum well (SQW) structure or a quantum dot, a nanowire, or a nanorod may be used.

The light emitting device 600 may include first and second electrode pads 615a and 615b electrically connected to the first and second conductivity-type semiconductor layers 612 and 614, respectively. The first and second electrode pads 615a and 615b may be exposed and disposed to face in the same direction. The first and second electrode pads 615a and 615b may be electrically connected to a board through wire bonding or flipchip bonding.

Referring to FIG. 14, a light emitting device 700 may include a first conductivity-type semiconductor layer 712, an active layer 713, and a second conductivity-type semiconductor layer 714.

The light emitting device 700 may include first and second electrode pads 715a and 715b respectively connected to the first and second conductivity-type semiconductor layers 712 and 714. The first electrode pad 715a may include a conductive via 715a-1 connected to the first conductivity-type semiconductor layer 712 through the second conductivity-type semiconductor layer 714 and the active layer 713 and an electrode extending portion 715a-2 connected to the conductive via 715a-1. The conductive via 715a-1 may be surrounded by an insulating layer 716 so as to be electrically separated from the active layer 713 and the second conductivity-type semiconductor layer 714. The conductive via 715a-1 may be disposed in a region formed by etching the semiconductor stacked body. The amount, shape, and pitch of conductive vias 715a-1, a contact area with the first conductivity-type semiconductor layer 712, and the like, may be appropriately designed such that contact resistance is reduced. The conductive vias 715a-1 may be arranged in rows and columns on the semiconductor stacked body in order to improve a current flow. The second electrode pad 715b may include an ohmic contact layer 715b-1 and an electrode extending portion 715b-2 on the second conductivity-type semiconductor layer 714. The amount and a contact area of the plurality of conductive vias may be adjusted such that the area of the plurality of conductive vias forming rows and columns on the plane of the region in which the plurality of conductive vias are in contact with the first conductivity-type semiconductor layer is within a range of 0.5% to 20% of the entire area of the plane of the light emitting stacked body. A diameter DV of the conductive via in the region in which the conductive via is in contact with the first conductivity-type semiconductor layer may range from 5 μm to 50 μm, for example, and the amount of the conductive vias may range 3 to 300 per light emitting stacked body region depending on the width of the light emitting stacked body region. Although it will be different according to areas of the light emitting stacked body region, preferably, four or more conductive vias may be provided and may have a matrix structure including rows and columns in which a distance between the conductive vias ranges from 100 μm to 500 μm. More preferably, the distance between conductive vias may range from 150 μm to 450 μm. When the distance between the conductive vias is smaller than 100 μm, the number of vias may increase and a light emitting area is relatively reduced, lowering luminous efficiency, and if the distance is greater than 500 μm, a current is difficult to spread, degrading luminous efficiency. A depth of the conductive vias may differ depending on thicknesses of the second conductivity-type semiconductor layer and the active layer, and, for example, it may range from 0.5 μm to 5.0 μm.

A light emitting device 800 illustrated in FIG. 15 includes a growth substrate 811, a first conductivity-type semiconductor base layer 812 formed on the growth substrate 811, and a plurality of light emitting nanostructures 817 formed on the first conductivity-type semiconductor base layer 812. The light emitting device 800 may further include an insulating layer 818 and a filler portion 819.

Each of the plurality of light emitting nanostructures 817 includes a first conductivity-type semiconductor core 817a, and an active layer 817b and a second conductivity-type semiconductor layer 817c sequentially formed as shell layers on the surface of the first conductivity-type semiconductor core 817a. Each of the light emitting nanostructures 817 may have any other structure such as a pyramid structure, as well as the core-shell structure. The first conductivity-type semiconductor base layer 812 may be a layer providing a growth surface for the light emitting nanostructures 817. The insulating layer 818 may provide an open region allowing the light emitting nanostructures 817 to be grown, and may be formed of a dielectric material such as $SiO_2$ or $SiN_x$. The filler portion 819 may structurally stabilize the light emitting nanostructures 817 and allows light to be transmitted or reflected. Alternatively, in a case in which the filler portion 819 includes a light-transmissive material, the filler portion 819 may be formed of a transparent material such as $SiO_2$, SiNx, an elastic resin, silicon, an epoxy resin, a polymer, or plastic. If necessary, in a case in which the filler portion 819 includes a reflective material, the filler portion 819 may be formed of metal powder or ceramic powder having high reflectivity mixed with a polymer material such as polypthalamide (PPA), or the like. The highly reflective ceramic powder may be at least one selected from the group consisting of $TiO_2$, $Al_2O_3$, $Nb_2O_5$, $Al_2O_2$, and ZnO. Alternatively, a highly reflective metal such as aluminum (Al) or silver (Ag) may be used.

The first and second electrode pads 815a and 815b may be disposed on lower surfaces of the light emitting nanostructures 817. The first electrode pad 815a is positioned on an exposed upper surface of the first conductivity-type semiconductor base layer 812, and the second electrode pad 815b includes an ohmic contact layer 815b-1 and an electrode extending portion 815b-2 formed below the light emitting nanostructures 817 and the filler portion 819. Alternatively, the ohmic contact layer 815b-1 and the electrode extending portion 815b-2 may be integrally formed.

The active layers 613, 713, and 817b illustrated in FIGS. 13-15 may be formed according the aforementioned active layer employed in the semiconductor light emitting device according to an exemplary embodiment of the present inventive concept.

Figure 16:
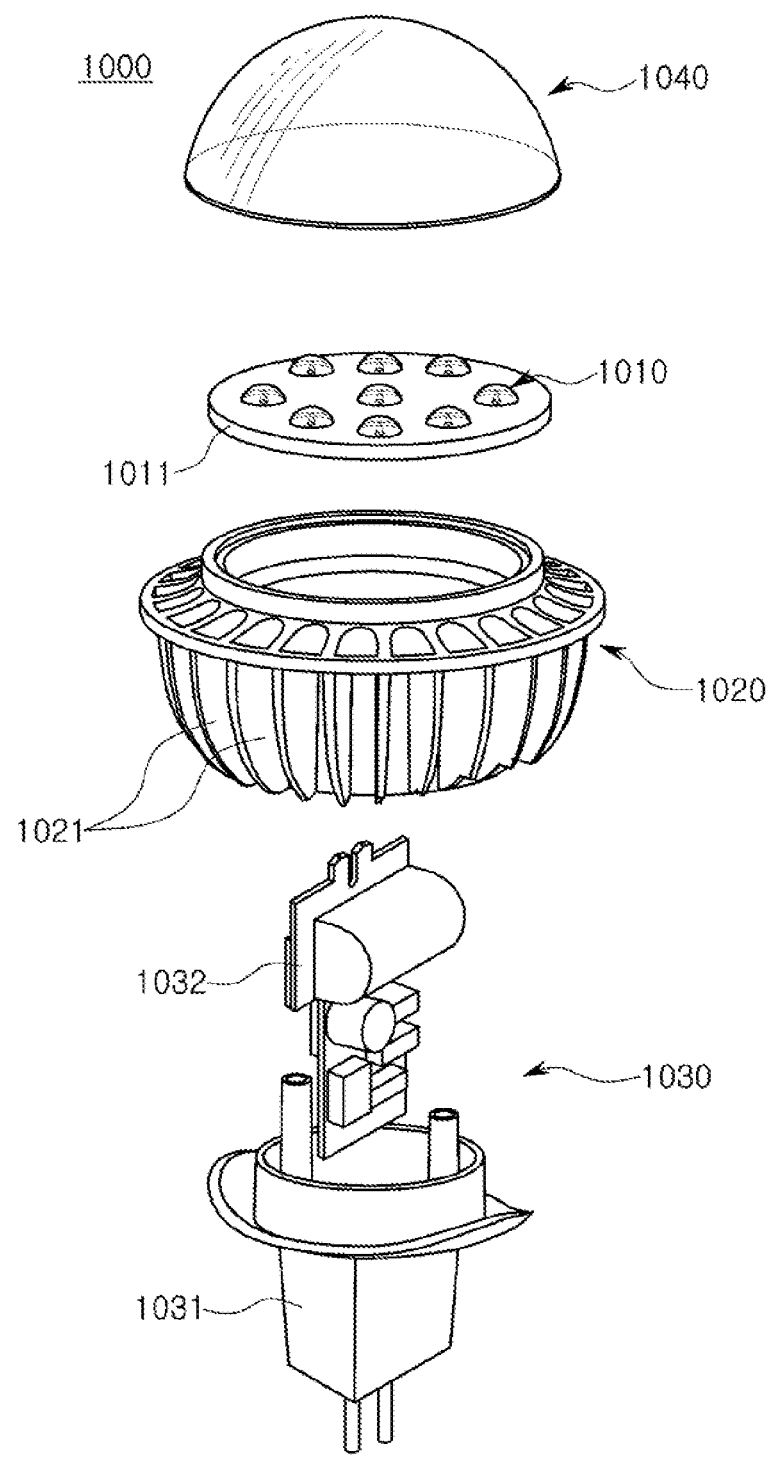
FIG. 16 is an exploded perspective view schematically illustrating a lighting device (bulb type) according to an exemplary embodiment of the present inventive concept.

FIG. 16 is an exploded perspective view schematically illustrating a lighting device according to an exemplary embodiment of the present inventive concept.

Referring to FIG. 16, a lighting device 1000 according to an exemplary embodiment may be a bulb-type lamp and may be used as an indoor lighting device. The lighting device 1000 may include a housing 1020 having an electrical connection structure 1030 and at least one light source module 1010 mounted on the housing 1020. The lighting device 1000 may further include a cover 1040 covering the at least one light source module 1010.

The light source module 1010 is substantially the same as the light source module of FIG. 7, and thus, a detailed description thereof will be omitted. A plurality of light source modules 1010 may be mounted on a circuit board 1011. The amount of light source modules 1010 may be variously adjusted as needed.

The housing 1020 serves as both a frame supporting the light source module 1010 and as a heat sink dissipating heat generated by the light source module 1010 outwardly. To this end, the housing 1020 may be formed of a solid material having a high heat conductivity. For example, the housing 1020 may be formed of a metal such as aluminum (Al), or a heat dissipation resin.

A plurality of heat dissipation fins 1021 may be provided on an outer surface of the housing 1020 in order to increase a contact area with air to enhance heat dissipation efficiency.

The electrical connection structure 1030 electrically connected to the light source module 1010 is provided in the housing 1020. The electrical connection structure 1030 may include a terminal unit 1031 and a driving unit 1032 supplying driving power supplied through the terminal unit 1031 to the light source module 1010.

The terminal unit 1031 serves to allow the lighting device 1000 to be fixedly installed in, for example, a socket, or the like, so as to be fixed and electrically connected. In the present exemplary embodiment, the terminal unit 1031 is illustrated as having a slidably inserted pin-type structure, but the structure of the terminal unit 1031 is not limited thereto. If necessary, the terminal unit 1031 may have an Edison type structure having threads going around to be inserted.

The driving unit 1032 serves to convert external driving power into a current source appropriate for driving the light source module 1010, and provide the same. The driving unit 1032 may be configured as, for example, an AC-DC converter, a rectifying circuit component, or a fuse. Also, the driving unit 1032 may further include a communications module realizing remote controlling according to circumstances.

The cover 1040 may be installed on the housing 1020 to cover the at least one light source module 1010 and may have a convex lens shape or a bulb shape. The cover 1040 may be formed of a light-transmissive material and contain a light dispersion material.

Figure 17:
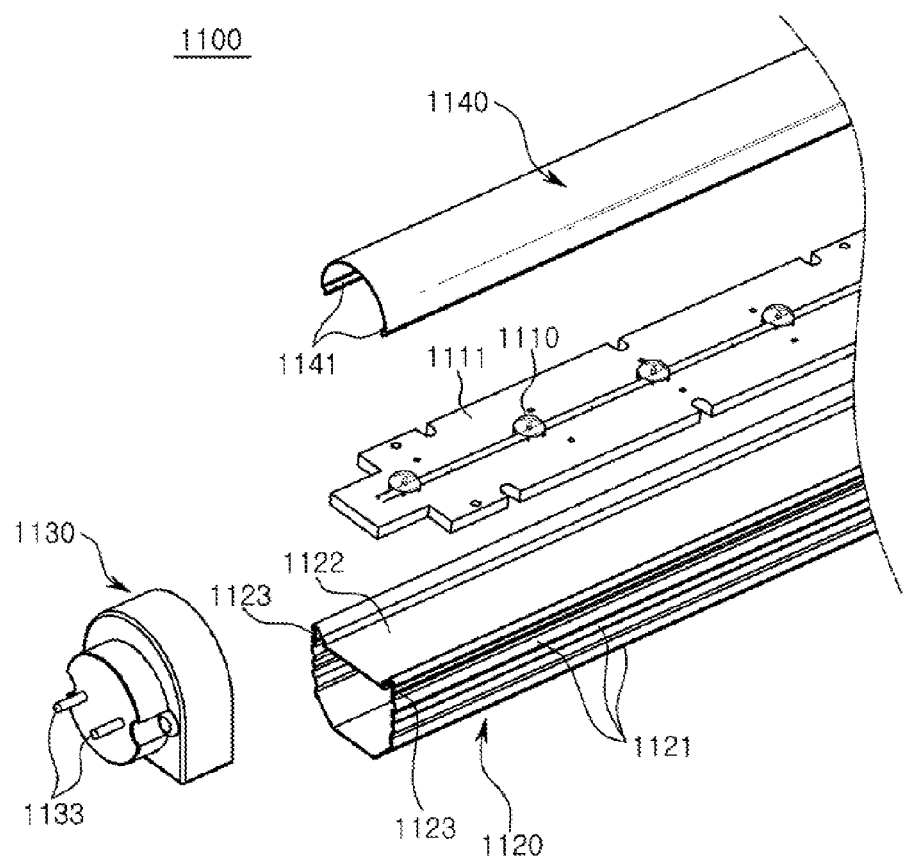
FIG. 17 is an exploded perspective view schematically illustrating a lighting device (CFL lamp L-type) according to an exemplary embodiment of the present inventive concept.

FIG. 17 is an exploded perspective view schematically illustrating a lighting device according to another exemplary embodiment of the present inventive concept.

Referring to FIG. 17, a lighting device 1100 may be, for example, a bar-type lamp and include a light source module 1110, a housing 1120, a terminal 1130, and a cover 1140.

As the light source module 1110, the light emitting device packages illustrated in FIGS. 8 and 9 may be employed, so a detailed description will be omitted. A plurality of light source modules 1110 may be mounted on a circuit board 1111, and the amount of mounted light source modules may be variously adjusted as needed.

The housing 1120 may allow the light source module 1110 to be fixedly mounted on one surface 1122 thereof and dissipate heat generated by the light source module 1110 outwardly. To this end, the housing 1120 may be formed of a material having excellent thermal conductivity, for example, metal, and a plurality of heat dissipation fins 1121 may protrude from both lateral surfaces of the housing 1120 to dissipate heat.

A plurality of light source modules 1110 in a state of being mounted and arranged on the circuit board 1111 may be installed on one surface 1122 of the housing 1120.

The cover 1140 is fastened to stoppage grooves 1123 of the housing 1120 to cover the light source modules 1110. The cover 1140 may have a semicircular curved surface to allow light generated by the light source modules 1110 to be uniformly radiated to the outside overall. Protrusions 1141 may be formed in a longitudinal direction on a bottom surface of the cover 1140 and engaged with the stoppage grooves 1123 of the housing 1120.

The terminal 1130 may be provided on at least one open side, among both end portions of the housing 1120 in a longitudinal direction to supply power to the light source modules 1110 and include electrode pins 1133 protruding outwardly.

Figure 18:
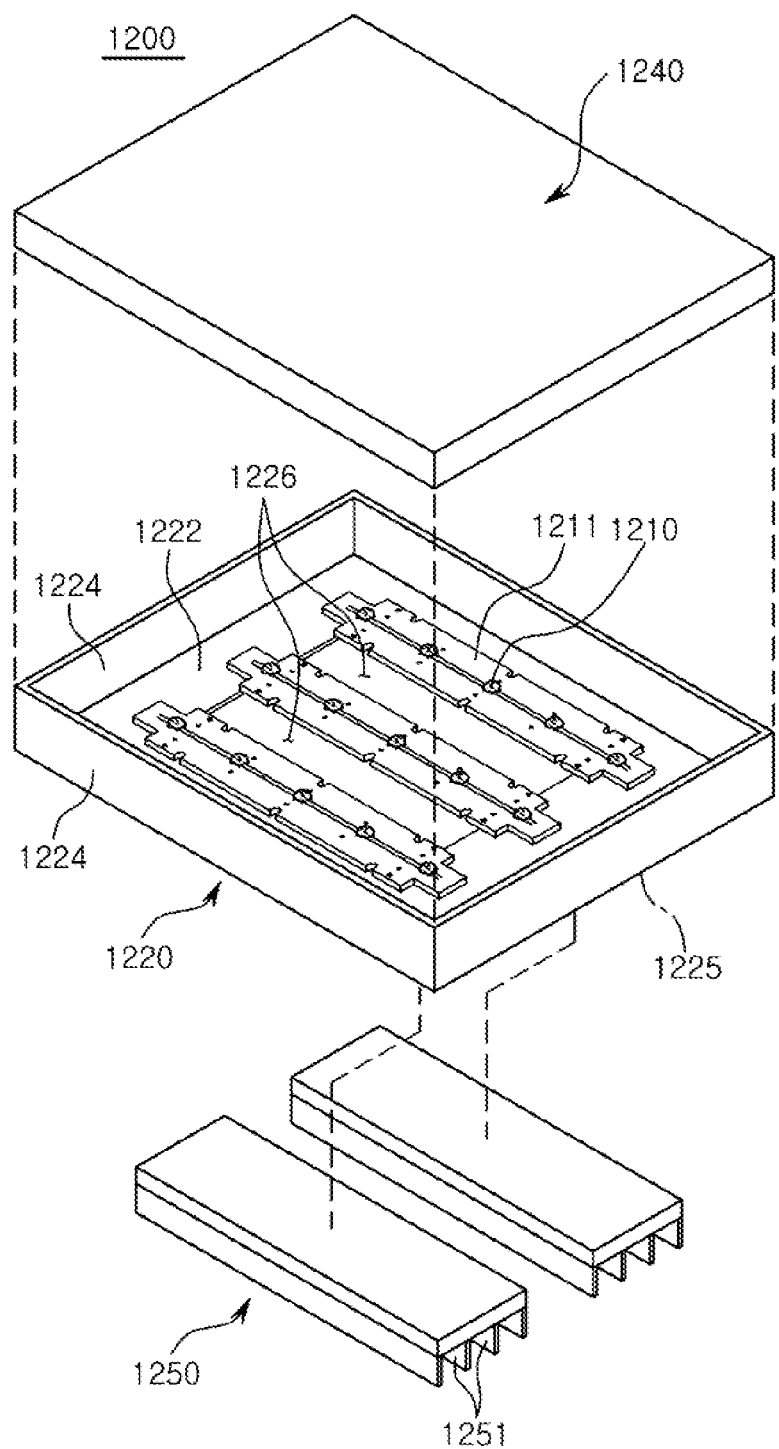
FIG. 18 is an exploded perspective view schematically illustrating a lighting device (planar type) according to an exemplary embodiment of the present inventive concept.

FIG. 18 is an exploded perspective view schematically illustrating a lighting device according to another exemplary embodiment of the present disclosure.

Referring to FIG. 18, a lighting device 1200 may have, for example, a surface light source-type structure and may include a light source module 1210, a housing 1220, a cover 1240, and a heat sink 1250.

As the light source module 1210, the light emitting device packages illustrated in FIGS. 8 and 9 may be employed, so a detailed description thereof will be omitted. A plurality of light source modules 1210 may be mounted and arranged on a circuit board 1211.

The housing 1220 may have a box-shaped structure including one surface 1222 on which the light source module 1210 is mounted and lateral surfaces 1224 extending from the circumference of the one surface 1222. The housing 1220 may be formed of a material having excellent thermal conductivity, for example, a metal, that may dissipate heat generated by the light source module 1210 outwardly.

A hole 1226 to which the heat sink 1250 (to be described below) is insertedly fastened may be formed in the one surface 1222 of the housing 1220 in a penetrating manner. The circuit board 1211 mounted on the one surface 1222 and having the light source modules 1210 thereon may partially span the hole 1226 so as to be exposed to the outside.

The cover 1240 may be fastened to the housing 1220 to cover the light source modules 1210. The cover 1240 may have an overall flat structure.

The heat sink 1250 may be fastened to the hole 1226 through the other surface 1225 of the housing 1220. The heat sink 1250 may be in contact with the light source module 1210 through the hole 1226 to dissipate heat from the light source module 1210 outwardly. In order to increase heat dissipation efficiency, the heat sink 1250 may have a plurality of heat dissipation fins 1251. The heat sink 1250 may be formed of a material having excellent thermal conductivity, like the housing 1220.

A lighting device using a light emitting device may be applied to an indoor lighting device or an outdoor lighting device according to the purposes thereof. The indoor light emitting device lighting device may include a lamp, a fluorescent lamp (LED-tube), or a flat panel type lighting device replacing an existing lighting fixture (retrofit), and the outdoor light emitting device lighting device may include a streetlight, a security light, a floodlight, a scene lamp, a traffic light, and the like.

Also, the lighting device using LEDs may be utilized as an internal or external light source of a vehicle. As an internal light source, the LED lighting device may be used as an indoor light, a reading light, or as various dashboard light sources of a vehicle. As an external light source, the LED lighting device may be used as a headlight, a brake light, a turn signal lamp, a fog light, a running light, and the like.

In addition, the light emitting device lighting device may also be applicable as a light source used in robots or various mechanic facilities. Light emitting device lighting using light within a particular wavelength band may promote plant growth and stabilize a person's mood or treat diseases using emotional lighting (be used therapeutically as to promote emotional states).

A lighting system employing the lighting devices described above with reference to FIGS. 19 through 21 will be described. A lighting system 2000 according to the present exemplary embodiment may automatically regulate a color temperature according to a surrounding environment (for example, temperature and humidity) and provide a lighting device used for emotional lighting satisfying human emotions, rather than serving as simple lighting.

Figure 19:
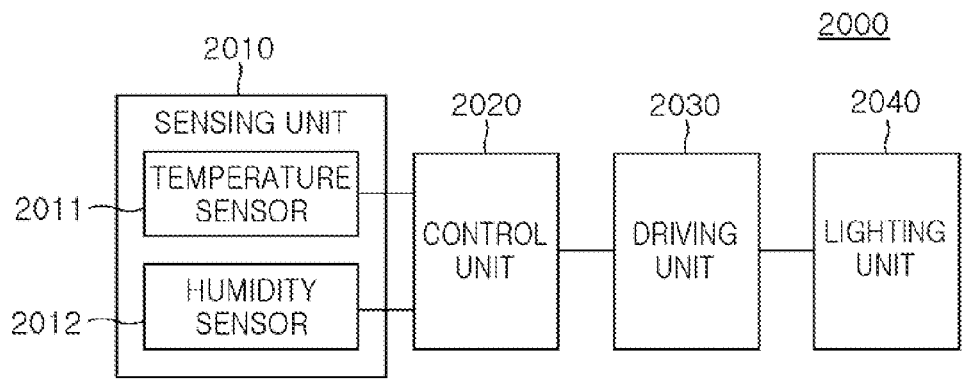
FIG. 19 is a block diagram schematically illustrating a lighting system according to an exemplary embodiment of the present inventive concept.

FIG. 19 is a block diagram schematically illustrating a lighting system according to an exemplary embodiment of the present inventive concept.

Referring to FIG. 19, a lighting system 2000 according to an exemplary embodiment of the present inventive concept may include a sensing unit 2010, a control unit 2020, a driving unit 2030, and a lighting unit 2040.

The sensing unit 2010 may be installed indoors or outdoors, and may have a temperature sensor 2011 and a humidity sensor 2012 to measure at least one air condition among an ambient temperature and humidity. The sensing unit 2010 delivers the measured temperature and humidity to the control unit 2020 electrically connected thereto.

The control unit 2020 may compare the measured air temperature and humidity with air conditions (temperature and humidity ranges) previously set by a user, and determine a color temperature of the lighting unit 2040 corresponding to the air condition. The control unit 2020 may be electrically connected to the driving unit 2030, and control the driving unit 2030 to drive the lighting unit 2040 at the determined color temperature. In the present exemplary embodiment, controlling of a color temperature according to sensing of a temperature or humidity is described, but controlling of a color temperature is not limited thereto and, for example, a color temperature may be controlled according to changes in ambient brightness. Indoor brightness may be sensed according to outdoor brightness in the morning, at noon, and at night to control a color temperature and brightness of indoor lighting, and ambient brightness may be sensed according to brightness of an indoor TV screen to control color temperature and brightness of lighting.

Figure 20:
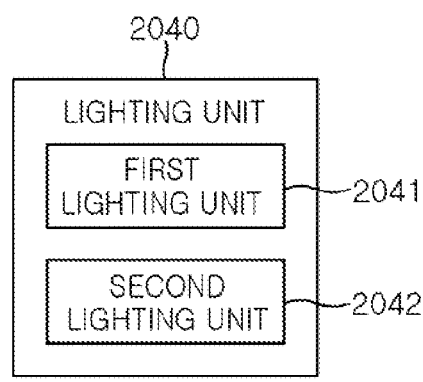
FIG. 20 is a block diagram schematically illustrating a detailed configuration of a lighting unit of the lighting system illustrated of FIG. 19.

FIG. 20 is a view illustrating components of the lighting unit 2040 of FIG. 19.

Referring to FIG. 20, the lighting unit 2040 operates according to power supplied by the driving unit 2030. The lighting unit 2040 may include at least one lighting device illustrated in FIGS. 16 to 18. For example, the lighting unit 2040 may include a first lighting unit 2041 and a second lighting unit 2042 having different color temperatures, and each of the lighting units 2041 and 2042 may include a plurality of light emitting devices having similar color temperatures.

The first lighting unit 2041 may emit white light having a first color temperature, and the second lighting unit 2042 may emit white light having a second color temperature, and in this case, the first color temperature may be lower than the second color temperature. Conversely, the first color temperature may be higher than the second color temperature. Here, white color having a relatively low color temperature is considered a warm white color having a color temperature ranging from 2,000 K to 5,000 K, and white color having a relatively high color temperature is considered a cold white color having a color temperature ranging from 5,000K to 10,000 K. When power is supplied to the first and second lighting units 2041 and 2042, the first and second lighting units 2041 and 2042 emit white light having first and second color temperatures, respectively, and their respective white light may be mixed to form white light having a color temperature determined by the control unit 2020. The first lighting unit 2041 and the second lighting unit 2042 may be configured as a single module. The effect such as that of FIG. 20 may be obtained by combining a plurality of different white light emitting device having different color temperatures, and blue, red, and green light emitting devices as illustrated with reference to FIGS. 11 and 12.

In detail, in a case in which the first color temperature is lower than the second color temperature, if the color temperature determined by the control unit 2020 is relatively high, an amount of light from the first lighting unit 2041 may be reduced and an amount of light from the second lighting unit 2042 may be increased to allow mixed white light to have the determined color temperature. Conversely, when the determined color temperature is relatively low, an amount of light from the first lighting unit 2041 may be increased and an amount of light from the second lighting unit 2042 may be reduced to allow mixed white light to have the determined color temperature. Here, the amount of light from each of the lighting units 2041 and 2042 may be implemented by regulating an amount of power supplied from the driving unit 2030 to the entirety of light emitting devices or by regulating the amount of light emitting devices driven.

Figure 21:
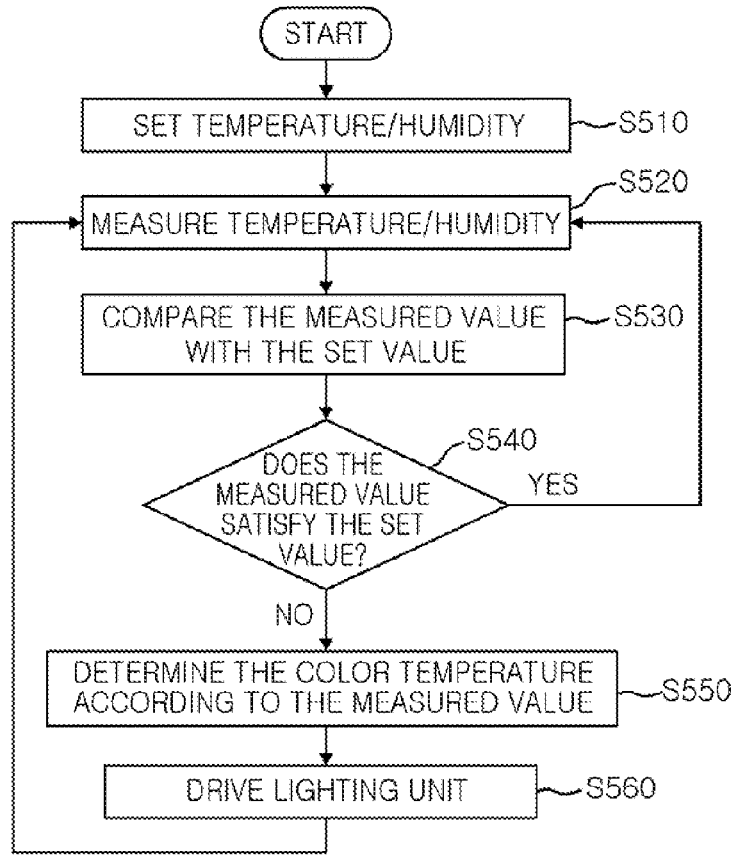
FIG. 21 is a flow chart illustrating a method for controlling the lighting system illustrated in FIG. 19.

FIG. 21 is a flowchart illustrating a method of controlling the lighting system of FIG. 19.

Referring to FIG. 21, the user first sets a color temperature according to temperature and humidity ranges through the control unit 2020 in operation S510. The set temperature and humidity data are stored in the control unit 2020.

In general, when a color temperature is higher than or equal to 6,000K, a color providing a cool feeling, such as blue, may be produced, and when a color temperature is lower than 4,000K, a color providing a warm feeling, such as red, may be produced. Thus, in the present exemplary embodiment, when temperature and humidity exceed 20° C. and 60%, respectively, the user may set the lighting unit 2040 to be turned on to have a color temperature higher than 6,000K through the control unit 2020; when the temperature and humidity range from 10° C. to 20° C. and 40% to 60%, respectively, the user may set the lighting unit 2040 to be turned on to have a color temperature ranging from 4,000K to 6,000K; and when the temperature and humidity are lower than 10° C. and 40%, respectively, the user may set the lighting unit 2040 to be turned on to have a color temperature lower than 4,000K.

In the present exemplary embodiment, controlling of a color temperature according to sensing of a temperature or humidity is described, but, in addition, for example, a color temperature may be controlled according to changes in ambient brightness. Indoor brightness may be sensed according to outdoor brightness in the morning, at noon, and at night to control a color temperature and brightness of indoor lighting, and ambient brightness may be sensed according to brightness of an indoor TV screen to control color temperature and brightness of lighting.

Next, the sensing unit 2010 measures at least one of conditions among ambient temperature and humidity in operation S520. The temperature and humidity measured by the sensing unit 2010 are delivered to the control unit 2020.

Subsequently, the control unit 2020 compares the measurement values delivered from the sensing unit 2010 with set values in operation S530. Here, the measured values are temperature and humidity data measured by the sensing unit 2010, and the set values are temperature and humidity data which have been set by the user and stored in the control unit 2020 in advance. Namely, the control unit 2020 compares the measured temperature and humidity with the set temperature and humidity, respectively.

According to the comparison results, the control unit 2020 determines whether the measurement values satisfy the set value ranges in operation S540. When the measurement values satisfy the set values, the control unit 2020 maintains the current color temperature, and again measures the temperature and humidity in operation S520. Meanwhile, when the measurement values do not satisfy the set values, the control unit 2020 detects set values corresponding to the measurement values, and determines a corresponding color temperature in operation S550. The control unit 2020 controls the driving unit 1030 to drive the lighting unit 2040 at the determined color temperature.

Then, the driving unit 2030 drives the lighting unit 2040 to have the determined color temperature in operation S560. Namely, the driving unit 2030 supplies the power required for the lighting unit 2040 to realize the predetermined color temperature. Accordingly, the lighting unit 2040 may be adjusted to have a color temperature corresponding to the temperature and humidity previously set by the user according to ambient temperature and humidity.

In this manner, the lighting system is able to automatically regulate a color temperature of the indoor lighting according to changes in ambient temperature and humidity, thereby satisfying human emotions varying according to changes in the surrounding natural environment and providing psychological stability.

Figure 22:
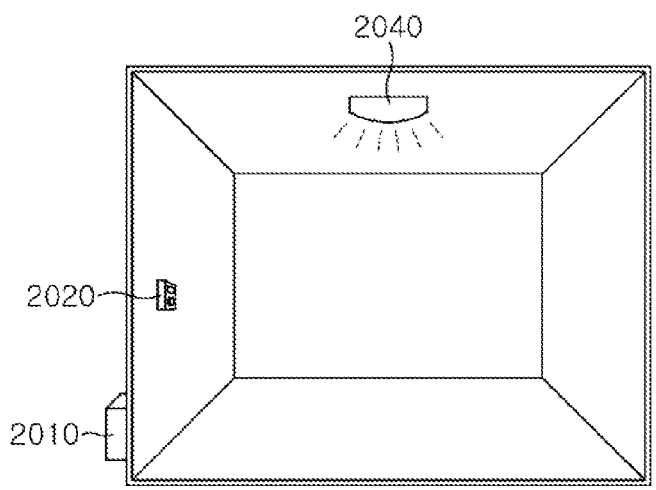
FIG. 22 is a view schematically illustrating the way in which the lighting system illustrated in FIG. 19 is used.

FIG. 22 is a view schematically illustrating the use of the lighting system of FIG. 19.

Referring to FIG. 22, the lighting unit 2040 may be installed on the ceiling as an indoor lamp. Here, the sensing unit 2010 may be implemented as a separate device and installed on an external wall in order to measure outdoor temperature and humidity. The control unit 2020 may be installed in an indoor area to allow the user to easily perform setting and ascertainment operations. The lighting system is not limited thereto, and may be installed on the wall in place of an interior illumination device or may be applied to a lamp, such as a desk lamp, that can be used indoors and outdoors. The temperature and humidity sensing device may sense a temperature and humidity of an indoor area, as well as an outdoor area, and maintain the indoor area under particular temperature and humidity conditions by interworking with an indoor temperature and humidity sensor controller through visible light communication (VLC) using a particular frequency of the indoor illumination light, thus maintain a comfortable indoor atmosphere. In the exemplary embodiment described above, it is described that temperature and humidity are sensed, but without being limited thereto, a color temperature of indoor lighting may be controlled by sensing brightness of an outdoor area (morning, noon, night) or ambient brightness of an indoor area, for example, brightness of a TV screen.

The lighting device using an LED as described above may be altered in terms of an optical design thereof according to a product type, a location, and a purpose. For example, in relation to the foregoing emotional illumination, a technique for controlling lighting by using a wireless (remote) control technique utilizing a portable device such as a smartphone may be provided, in addition to a technique of controlling a color, temperature, brightness, and a hue of illumination (or lighting).

Also, in addition, a visible wireless communications technology aimed at simultaneously achieving a unique purpose of a light emitting device light source and a purpose of a communications unit by adding a communications function to light emitting device lighting devices and display devices may be available. This is because a light emitting device light source has a longer lifespan and excellent power efficiency, implements various colors, supports a high switching rate for digital communications, and is available for digital control, in comparison with existing light sources.

The visible light wireless communications technology is a wireless communications technology transferring information wirelessly by using light having a visible light wavelength band recognizable by the human eye. The visible light wireless communications technology is distinguished from a wired optical communications technology in that it uses light having a visible light wavelength band, and that a communications environment is based on a wireless scheme.

Also, unlike RF wireless communications, the visible light wireless communications technology has excellent convenience and physical security properties as it can be freely used without being regulated or needing permission in the aspect of frequency usage, is differentiated in that a user can check a communications link with his/her eyes, and above all, the visible light wireless communications technology has features as a fusion technique obtaining both a unique purpose as a light source and a communications function.

As set forth above, the semiconductor light emitting device according to exemplary embodiments of the present disclosure has increased luminance efficiency by preventing a degradation of an active layer and increasing injection efficiency of holes and electrons into the active layer.

While exemplary embodiments have been shown and described above, it will be apparent to those skilled in the art that modifications and variations could be made without departing from the scope of the present invention as defined by the appended claims.

What is claimed is:

1. A semiconductor light emitting device comprising:
   a first conductivity-type semiconductor layer;
   an active layer disposed on the first conductivity-type semiconductor layer and including a plurality of quantum barrier layers and a plurality of quantum well layers which are alternately stacked; and
   a second conductivity-type semiconductor layer disposed on the active layer,
   wherein a quantum barrier layer closest to the second conductivity-type semiconductor layer, among the plurality of quantum barrier layers, includes a first undoped region and a first doped region disposed on the first undoped region and having a thickness greater than or equal to a thickness of the first undoped region, and
   each of the first undoped region and the first doped region includes a plurality of first unit layers having different energy band gaps, and at least one hole accumulation region configured by arranging the first unit layers such that adjacent ones of the first unit layers have different energy band gaps from each other.

2. The semiconductor light emitting device of claim 1, wherein the plurality of first unit layers comprise a first layer and a second layer having an energy band gap smaller than an energy band gap of the first layer.

3. The semiconductor light emitting device of claim 2, wherein the plurality of first unit layers comprise a third layer having an energy band gap greater than an energy band gap of the first layer.

4. The semiconductor light emitting device of claim 1, wherein at least one of the first undoped region and the first doped region has a stacked structure of GaN/InGaN/AlGaN/InGaN/GaN.

5. The semiconductor light emitting device of claim 1, wherein the first doped region is contiguous with the second conductivity-type semiconductor layer.

6. The semiconductor light emitting device of claim 1, wherein the first doped region is doped with a second conductivity-type dopant.

7. The semiconductor light emitting device of claim 1, wherein a thickness of each of the first unit layers forming the first doped region ranges from 0.5 nm to 4.5 nm.

8. The semiconductor light emitting device of claim 1, wherein a thickness of each of the first unit layers forming the first undoped region ranges from 0.1 nm to 0.5 nm.

9. The semiconductor light emitting device of claim 1, wherein at least one of the quantum barrier layers excluding the quantum barrier layer closest to the second conductivity-type semiconductor layer, among the plurality of quantum barrier layers, comprises a second doped region and a second undoped region disposed on the second doped region and having a thickness smaller than or equal to a thickness of the second doped region, and
   each of the second undoped region and the second doped region comprises a plurality of second unit layers having different energy band gaps, and at least one electron accumulation region configured by arranging the second unit layers such that adjacent ones of the second unit layers have different energy band gaps from each other.

10. The semiconductor light emitting device of claim 9, wherein the plurality of second unit layers comprise a first layer and a second layer having an energy band gap smaller than an energy band gap of the first layer.

11. The semiconductor light emitting device of claim 10, wherein the plurality of second unit layers comprise a third layer having an energy band gap greater than an energy band gap of the first layer.

12. The semiconductor light emitting device of claim 9, wherein at least one of the second undoped region and the second doped region has a stacked structure of GaN/InGaN/AlGaN/InGaN/GaN.

13. The semiconductor light emitting device of claim 9, wherein the second doped region is doped with a first conductivity-type dopant.

14. A semiconductor light emitting device comprising:
   a first conductivity-type semiconductor layer;
   an active layer disposed on the first conductivity-type semiconductor layer and including a plurality of quantum well layers and a plurality of quantum barrier layers which are alternately stacked; and
   a second conductivity-type semiconductor layer disposed on the active layer,
   wherein at least one of the plurality of quantum barrier layers includes an undoped region and a doped region,
   the undoped region includes an undoped well layer having an energy band gap smaller than or equal to energy band gaps of the plurality of quantum well layers, and a plurality of undoped barrier layers disposed on both sides of the undoped well layer and having an energy band gap greater than an energy band gap of the undoped well layer,
   the doped region includes a doped well layer having an energy band gap smaller than or equal to energy band gaps of the plurality of quantum well layers, and doped barrier layers disposed on both sides of the doped well layer and having an energy band gap greater than an energy band gap of the doped well layer, and
   a thickness of the doped region is greater than or equal to a thickness of the undoped region.

15. The semiconductor light emitting device of claim 14, wherein the doped region is contiguous with the second conductivity-type semiconductor layer and doped with a second conductivity-type dopant.

16. A semiconductor light emitting device comprising:
   a first conductivity-type semiconductor layer;
   a second conductivity-type semiconductor layer; and
   an active layer disposed between the first and second conductivity-type semiconductor layers and including a plurality of quantum barrier layers and a plurality of quantum well layers which are alternately stacked, wherein a first quantum barrier layer among the plurality of quantum barrier layers includes an undoped region and a doped region having a thickness greater than or equal to a thickness of the undoped region, and each of the undoped region and the doped region includes a plurality layers having different energy band gaps.

17. The semiconductor light emitting device of claim 16, wherein:

the first quantum barrier layer is a quantum barrier layer closest to the second conductivity-type semiconductor layer, among the plurality of quantum barrier layers, and a distance between the doped region of the first quantum barrier layer and the second conductivity-type semiconductor layer is less than a distance between the undoped region of the first quantum barrier layer and the second conductivity-type semiconductor layer.

18. The semiconductor light emitting device of claim 17, wherein:

a second quantum barrier layer among the plurality of quantum barrier layers includes an undoped region and a doped region having a thickness greater than or equal to a thickness of the undoped region of the second quantum barrier layer, and a distance between the doped region of the second quantum barrier layer and the first conductivity-type semiconductor layer is less than a distance between the undoped region of the second quantum barrier layer and the first conductivity-type semiconductor layer.

19. The semiconductor light emitting device of claim 16, wherein at least one of the undoped region and the doped region has a stacked structure of GaN/InGaN/AlGaN/InGaN/GaN.

20. The semiconductor light emitting device of claim 16, wherein a thickness of each layer forming the doped region ranges from 0.5 nm to 4.5 nm, and a thickness of each layer forming the undoped region ranges from 0.1 nm to 0.5 nm.

* * * * *